United States Patent
Cao et al.

(10) Patent No.: US 9,673,787 B2
(45) Date of Patent: Jun. 6, 2017

(54) POWER MULTIPLEXING WITH FLIP-FLOPS

(71) Applicant: QUALCOMM Incorporated, San Diego, CA (US)

(72) Inventors: Lipeng Cao, La Jolla, CA (US); Jeffrey Gemar, San Diego, CA (US); Ramaprasath Vilangudipitchai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 58 days.

(21) Appl. No.: 14/861,503

(22) Filed: Sep. 22, 2015

(65) Prior Publication Data

US 2017/0085253 A1    Mar. 23, 2017

(51) Int. Cl.
| | |
|---|---|
| *H03K 3/012* | (2006.01) |
| *H03K 3/3562* | (2006.01) |
| *H03K 3/037* | (2006.01) |
| *H03K 3/356* | (2006.01) |

(52) U.S. Cl.
CPC ........... *H03K 3/012* (2013.01); *H03K 3/0372* (2013.01); *H03K 3/3562* (2013.01); *H03K 3/356008* (2013.01)

(58) Field of Classification Search
CPC .................. H03K 3/012; H03K 3/0372; H03K 3/356008; H03K 3/3562; H03K 3/35625
See application file for complete search history.

(56) References Cited

U.S. PATENT DOCUMENTS

| | | | |
|---|---|---|---|
| 6,762,638 B2 | 7/2004 | Correale et al. | |
| 7,164,301 B2* | 1/2007 | Chun | H03K 3/356008 327/202 |
| 7,170,327 B2 | 1/2007 | Aksamit | |
| 7,548,103 B2* | 6/2009 | Ramaraju | H03K 3/012 327/200 |
| 7,639,056 B2 | 12/2009 | Gururajarao et al. | |
| 7,948,263 B2 | 5/2011 | Kim et al. | |
| 8,381,163 B2 | 2/2013 | Schreiber et al. | |
| 9,007,112 B2 | 4/2015 | Shen et al. | |
| 2005/0218943 A1 | 10/2005 | Padhye et al. | |
| 2006/0255849 A1 | 11/2006 | Chun et al. | |
| 2014/0266401 A1 | 9/2014 | Park et al. | |

FOREIGN PATENT DOCUMENTS

WO    2006127888 A2    11/2006

OTHER PUBLICATIONS

International Search Report and Written Opinion—PCT/US2016/048460—ISA/EPO—Nov. 22, 2016.

* cited by examiner

*Primary Examiner* — Patrick O'Neill
(74) *Attorney, Agent, or Firm* — Arent Fox, LLP

(57) ABSTRACT

Data retention circuitry, such as at least one integrated circuit (IC), is disclosed herein for power multiplexing with flip-flops having a retention feature. In an example aspect, an IC includes a first power rail and a second power rail. The IC further includes a flip-flop and power multiplexing circuitry. The flip flop includes a master portion and a slave portion. The master portion is coupled to the first power rail for a regular operational mode and for a retention operational mode. The power multiplexing circuitry is configured to couple the slave portion to the first power rail for the regular operational mode and to the second power rail for the retention operational mode.

26 Claims, 11 Drawing Sheets

POWER MULTIPLEXING WITH FLIP-FLOPS

BACKGROUND

Field of the Disclosure

This disclosure relates generally to power multiplexing with flip-flops that are deployed in an integrated circuit (IC) and, more specifically, to multiple flip-flops in which each flip-flop has a retention feature including a collapsible master portion and a live slave portion that is multiplexed onto two different power sources.

Description of Related Art

Power consumption of electronic devices is an increasingly important factor in electronic device design. From a global perspective, energy demands of electronic devices occupy a sizable percentage of total energy usage due to large corporate data centers and the ubiquity of personal computing devices. Environmental concerns thus motivate efforts to reduce the power consumption of electronic devices to help conserve the earth's resources. From an individual perspective, less power consumption translates to lower energy bills. Furthermore, many personal computing devices are powered by batteries. The less energy that is consumed by a portable battery-powered electronic device, the longer the portable device may operate without recharging the battery. Lower energy consumption also enables the use of smaller batteries and the adoption of thinner form factors, which means devices can be made more portable or convenient. Therefore, the popularity of portable electronic devices also motivates efforts to reduce the power consumption of electronic devices.

An electronic device consumes power if the device is coupled to a power source and is turned on. Although this is true for the entire electronic device, it is also true for individual parts of the electronic device. Hence, power may be conserved if parts of an electronic device are decoupled from power or turned off, even while other parts remain powered and turned on. Entire discrete components of an electronic device, such as a whole integrated circuit (IC) or a display screen, may be decoupled from power or turned off. Alternatively, selected parts of a discrete component may likewise be powered down. For example, a processing entity of an integrated circuit, such as a processing core, may be selectively powered down. Parts of an integrated circuit may be powered down intermittently if usage is regular but discontinuous, or parts may be powered down temporarily if usage has ceased for some period of time.

Powering down part of an integrated circuit, such as a core, can save power and extend battery life. Unfortunately, powering down a core of an integrated circuit can also create problems. For example, resuming a computing task with a powered down core takes time, which can slow performance and adversely impact a user experience. Operational data for a computing task may also be lost if power is removed from certain types of computer memory. Losing operational data may force an application to restart or permanently damage user files, such as documents or pictures. To avoid a loss of operational data when a core of an integrated circuit is being powered down, the operational data may be moved from a proximate, high-speed memory to a remote or slower memory location prior to the core being powered down. When a time to awaken the core arrives, the operational data for the computing task is retrieved from the memory location for further processing. However, the memory location occupies some amount of the limited area of the integrated circuit, and the retrieval operation delays the resumption of the computing task from the powered down state.

SUMMARY

In an example aspect, data retention circuitry is disclosed. The data retention circuitry includes a first power rail and a second power rail. The data retention circuitry further includes a flip-flop and power multiplexing circuitry. The flip-flop includes a master portion and a slave portion. The master portion is coupled to the first power rail for a regular operational mode and for a retention operational mode. The power multiplexing circuitry is configured to couple the slave portion to the first power rail for the regular operational mode and to the second power rail for the retention operational mode.

In an example aspect, data retention circuitry is disclosed. The data retention circuitry includes a first power rail and a second power rail. The data retention circuitry also includes a flip-flop having a master portion and a slave portion. The master portion is coupled to the first power rail for both a regular operational mode and a retention operational mode. The slave portion is configured to retain slave data if the master portion experiences a power collapse for the retention operational mode. The data retention circuitry further includes means for power multiplexing the slave portion to the first power rail for the regular operational mode and to the second power rail for the retention operational mode.

In an example aspect, a method for power multiplexing with flip-flops is disclosed. The method includes supplying power to a master portion of a flip-flop using a first power supply via a first power rail for a regular operational mode. The method also includes supplying power to a slave portion of the flip-flop using the first power supply via the first power rail for the regular operational mode. During a power down transitional period after the regular operational mode and before a retention operational mode, the method includes switching the slave portion of the flip-flop from the first power supply to a second power supply. The method further includes supplying power to the slave portion of the flip-flop using the second power supply via a second power rail for the retention operational mode.

In an example aspect, data retention circuitry is disclosed. The data retention circuitry includes a collapsible power rail and a memory power rail. The collapsible power rail is configured to undergo a power collapse for a retention operational mode. The memory power rail is configured to sustain a voltage level that is sufficient to maintain contents of a memory for the retention operational mode. The data retention circuitry also includes a flip-flop having a master portion and a slave portion. The master portion is coupled to the collapsible power rail. The slave portion is configured to retain slave data for the retention operational mode if the master portion experiences the power collapse. The data retention circuitry further includes power management circuitry. The power management circuitry is configured to: couple the slave portion to the collapsible power rail for a regular operational mode; couple the slave portion to the memory power rail for the retention operational mode; and remove power from the collapsible power rail after the slave portion is coupled to the memory power rail for the retention operational mode.

DETAILED DESCRIPTION

Figure 1:
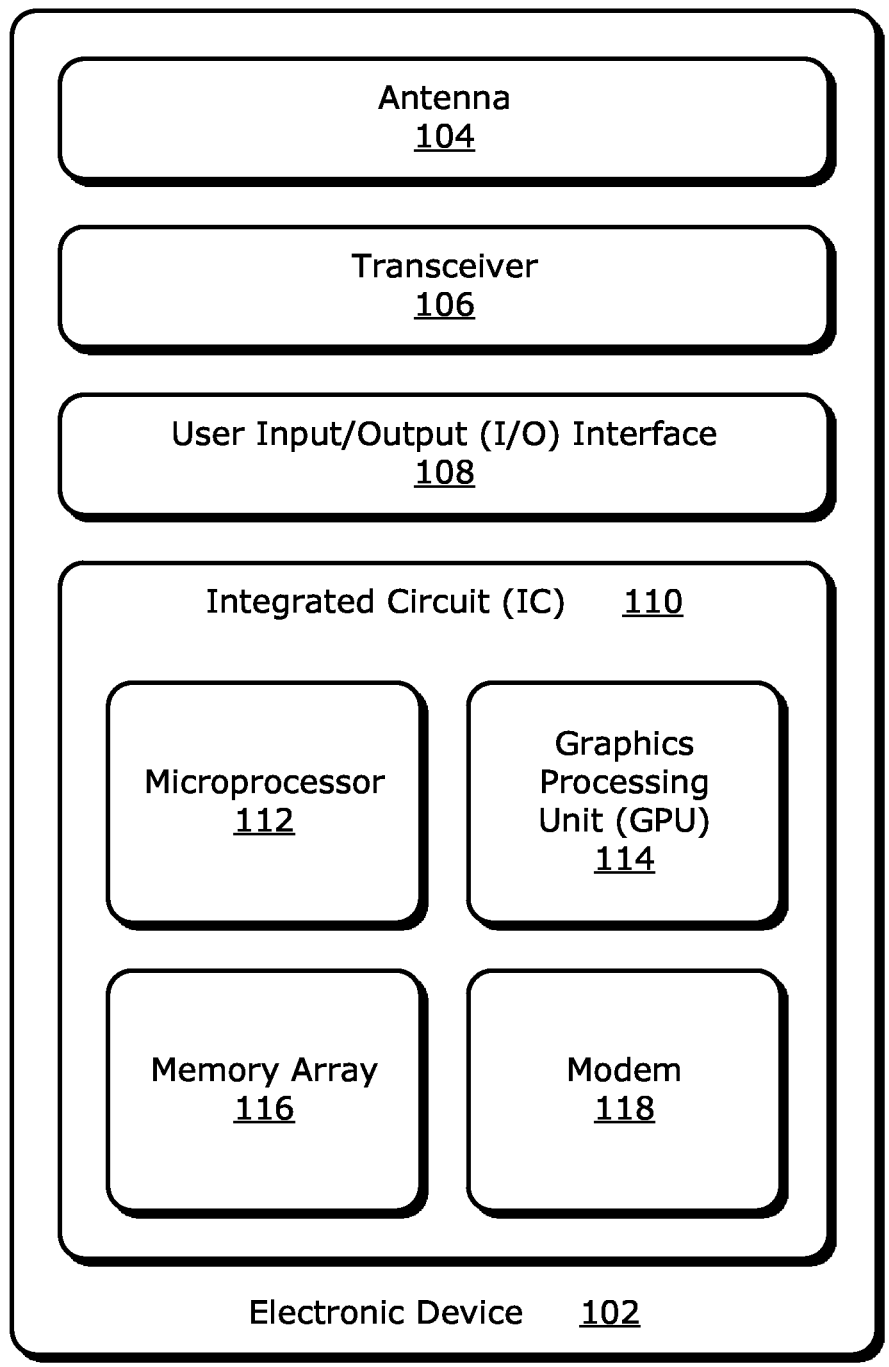
FIG. 1 depicts an example electronic device that includes an integrated circuit (IC).

An entire integrated circuit (IC) may be powered down to reduce energy consumption during times of complete non-use. At other times, however, selected parts of an integrated circuit, such as one or more cores, may be idle while other cores are used for processing, storing, or communicating. If an entire integrated circuit cannot be powered down, one or more cores may be powered down independently of other cores. For example, if an integrated circuit is waiting for additional data or user input before changing what is displayed on a screen, a graphics processing unit (GPU) core may be powered down. A modem that is idle may be powered down between incoming or outgoing communications. Also, if half of a memory is unused, the unused memory half may be powered down while the other half remains powered. Powering down at least part of an integrated circuit, such as a core, is called "power collapse" or a "power collapse event."

A core of an integrated circuit may include many flip-flops. A flip-flop (FF), which may also be called a flop, is a unit of computing memory that stores one bit of operational data. A flip-flop may include a master portion and a slave portion in which data is transferred internally from the master portion to the slave portion. Clocked flip-flops are configured such that data stored in the master portion is transferred to the slave portion responsive to an edge or a pulse of a clock signal.

Flip-flops are relatively fast memory units and are used quite frequently. Flip-flops are also volatile memory that relinquish stored data if powered down, such as with a power collapse of a corresponding core that includes the flip-flops. Accordingly, power management techniques can be utilized to carefully manage cores that include flip-flops. To prevent the loss of operational data that is stored in the flip-flops of a core experiencing power collapse, the stored data may be relocated to non-volatile memory that retains data without power, or to another core that is not being powered down. The relocated data is then returned to the flip-flops after the core is powered up again. However, this approach takes time and is resource intensive for the integrated circuit in terms of occupied chip area and signal routing congestion for the additional non-volatile memory or the communication lines.

To avoid relocating data, some flip-flops include a retention feature that renders the flip-flop capable of retaining data during a power collapse of a corresponding core. Such a flip-flop is termed a retention flip-flop (RFF). With one approach, a retention flip-flop is realized as a flip-flop having an additional associated latch and two level shifters. The additional latch is referred to as a balloon latch or shadow latch. The balloon latch is adapted to store data for a slave portion of the flip-flop as a master portion and the slave portion experience a power collapse. After the power collapse and upon resumption of computing activity, the balloon latch returns the data to the slave portion of the flip-flop or provides the data as an initial output of the flip-flop. However, retention flip-flops with balloon latches are large, occupying as much as three times the area of a standard flip-flop without a retention feature With another approach, a retention flip-flop is realized as a flip-flop in which a master portion and a slave portion are both coupled to a constant power rail of a core. Other circuitry that is coupled instead to a collapsible power rail lose power as a corresponding core experiences a power collapse. The constant power rail, on the other hand, continues to provide power to the retention flip-flop during a power collapse event. Although this approach maintains the data contents of the retention flip-flop and results in a retention flip-flop that is smaller than the former approach employing the balloon latch, both the master portion and the slave portion are consuming power via the constant power rail during the power collapse event. With yet another approach, a slave portion of a retention flip-flop is coupled to a constant power rail, and a corresponding master portion is switch-ably connected to the constant power rail. To implement a power collapse with respect to the retention flip-flop, the master is disconnected from the constant power rail in this approach. However, with both of these approaches, a power supply for the constant power rail continues to operate and consume power throughout the power collapse event.

One or more embodiments enable data contents of a flip-flop having a master portion and a slave portion to be retained during a power collapse event without using an additional latch. Slave data is stored by the slave portion during the power collapse event. The slave portion remains alive, but the master portion is permitted to experience a power collapse. In an example structure, isolation circuitry within a flip-flop is controlled during a power collapse event so as to prevent a collapsing voltage level in the master portion from corrupting the slave data stored by the slave portion.

In this manner, a flip-flop is provided with a retention feature in which slave data of a slave portion of the flip-flop is retained while a master portion of the flip-flop is permitted to experience a power collapse.

One or more embodiments enable at least a portion of a flip-flop to be multiplexed between at least two different power rails. More specifically, a slave portion of a flip-flop is multiplexed between a first power rail and a second power rail. For example, the slave portion is multiplexed onto a collapsible power rail during a regular operational mode. For a retention operational mode, the slave portion is multiplexed onto a memory power rail that is held at some voltage level during a power collapse event. A master portion of the flip-flop is coupled to the collapsible power rail for the regular operational mode and for the retention operational mode. A power supply that is coupled to the first, collapsible power rail may be turned off for the retention operational mode because the slave portion is coupled to the second, memory power rail during the retention operational mode.

In this manner, a retention flip-flop is provided in which a power supply that powers the retention flip-flop during a regular operational mode may be turned off during a retention operational mode.

FIG. 1 depicts an example electronic device 102 that includes an integrated circuit (IC) 110. As shown, the electronic device 102 includes an antenna 104, a transceiver 106, and a user input/output (I/O) interface 108 in addition to the IC 110. Illustrated examples of the IC 110 include a microprocessor 112, a graphics processing unit (GPU) 114, a memory array 116, and a modem 118.

The electronic device 102 may be a mobile or battery-powered device or a fixed device that is designed to be powered during operation by an electrical grid. Examples of an electronic device 102 include a server computer, a network switch or router, a blade of a data center, a personal computer, a desktop computer, a notebook computer, a tablet computer, a smart phone, an entertainment appliance, or a wearable computing device such as a smartwatch, intelligent glasses, or an article of clothing. An electronic device 102 may also be a device, or a portion thereof, having embedded electronics. Examples of an electronic device 102 with embedded electronics include a passenger vehicle, industrial equipment, a refrigerator or other home appliance, a drone or other unmanned aerial vehicle (UAV), or a power tool.

For an electronic device with a wireless capability, the electronic device 102 includes an antenna 104 that is coupled to a transceiver 106 to enable reception or transmission of one or more wireless signals. The IC 110 may be coupled to the transceiver 106 to enable the IC 110 to have access to received wireless signals or to provide wireless signals for transmission via the antenna 104. The electronic device 102 as shown also includes at least one user I/O interface 108. Examples of a user I/O interface 108 include a keyboard, a mouse, a microphone, a touch-sensitive screen, a camera, an accelerometer, a haptic mechanism, a speaker, a display screen, or a projector.

The IC 110 may comprise, for example, one or more instances of a microprocessor 112, a GPU 114, a memory array 116, a modem 118, and so forth. The microprocessor 112 may function as a central processing unit (CPU) or other general-purpose processor. Some microprocessors include different parts, such as multiple processing cores, that may be individually powered on or off. The GPU 114 may be especially adapted to process visual-related data to be displayed for a person. If visual-related data is not being processed or rendered, the GPU 114 may be powered down. The memory array 116 stores data for the microprocessor 112, the GPU 114, or user files. Example types of memory for the memory array 116 include random access memory (RAM), such as dynamic RAM (DRAM) or static RAM (SRAM), flash memory, and so forth. If programs are not accessing data stored in memory, the memory array 116 may be fully or partially powered down. The modem 118 modulates a signal to encode information into the signal or demodulates a signal to decode information present in the signal. If there is no information to encode or decode for outbound or inbound communications, the modem 118 may be idled to reduce power consumption. The IC 110 may include additional or alternative parts than those that are shown, such as an I/O interface, a transceiver or another part of a receiver chain, a customized or hard-coded processor such as an application-specific integrated circuit (ASIC), a sensor such as an accelerometer, and so forth.

The IC 110 may also comprise a system on a chip (SOC), which is not shown. An SOC may integrate a sufficient number or type of components to enable the SOC to provide computational functionality as a notebook, a mobile phone, or another electronic apparatus using primarily or exclusively one chip. Components of an SOC, or an IC 110 generally, may be termed cores or circuitry blocks. Examples of cores or circuitry blocks include a voltage regulator, a memory array, a memory controller, a general-purpose processor, a cryptographic processor, a modem, a vector processor, an I/O interface or communication controller, a wireless controller, or a GPU. Any of these example cores or circuitry blocks, such as a processor or GPU core, may further include multiple internal cores. A core of an SOC may be powered down if not in use according to the techniques described herein.

Figure 2:
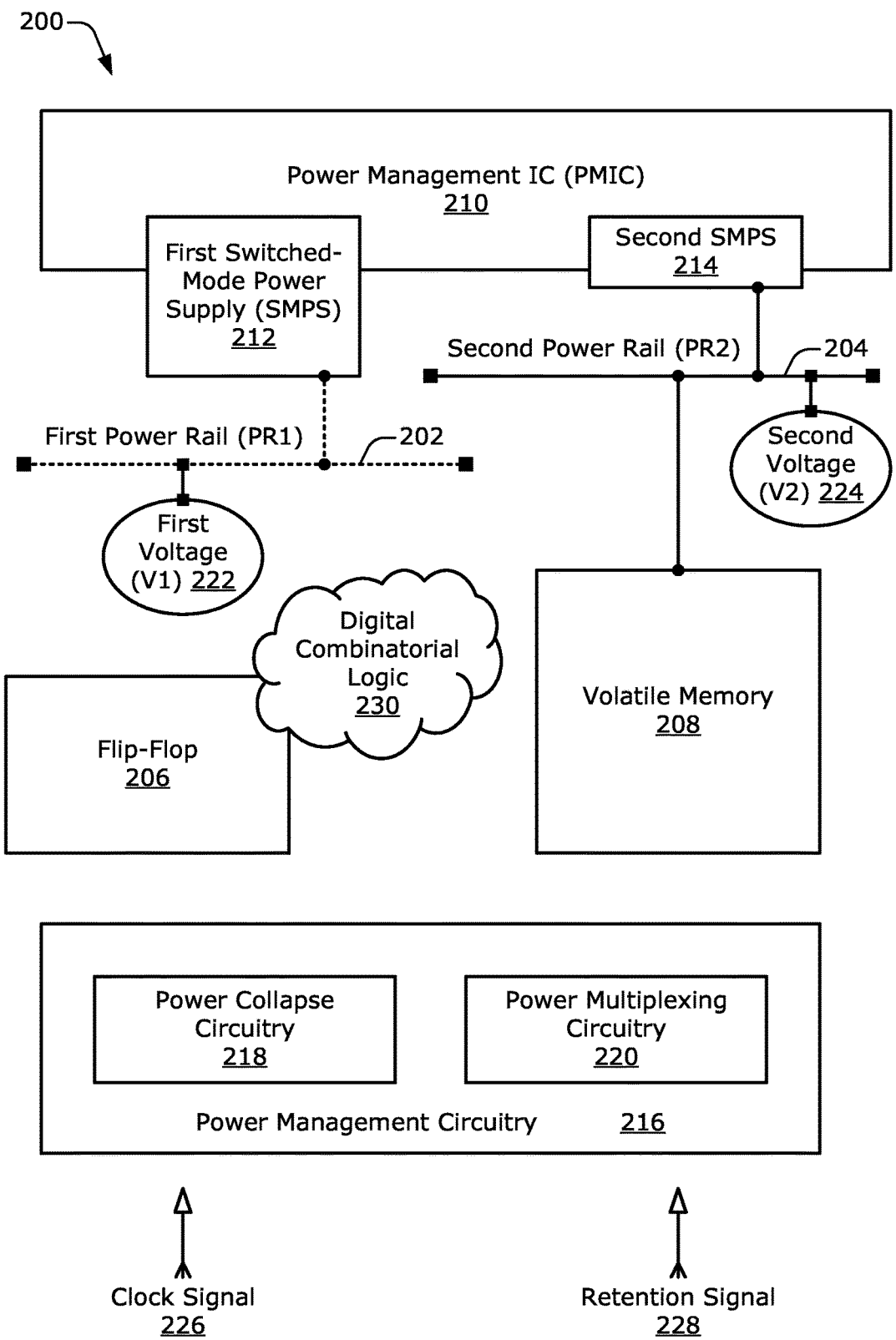
FIG. 2 depicts example data retention circuitry that includes two power rails, a flip-flop, and power management circuitry.

FIG. 2 depicts example data retention circuitry 200 that includes two power rails, a flip-flop 206, and power management circuitry 216. As illustrated, the data retention circuitry 200 includes a power management IC 210 (PMIC), a first switched-mode power supply 212 (SMPS), a second switched-mode power supply 214, a first power rail 202 (PR1), a second power rail 204 (PR2), the flip-flop 206, a volatile memory 208, the power management circuitry 216, and digital combinatorial logic 230. The data retention circuitry 200 generates or uses a clock signal 226, a retention signal 228, a first voltage 222 (V1), and a second voltage 224 (V2). The power management circuitry 216 includes power collapse circuitry 218 and power multiplexing circuitry 220. The data retention circuitry 200 may comprise one or more integrated circuits, may be formed from one or more integrated circuits, may be distributed over one or more integrated circuits, some combination thereof, and so forth.

In this particular example, two control signals are represented near the bottom of FIG. 2 as arrows. With regard to flip-flop operation, the clock signal 226 advances data from an input of a flip-flop, across a master portion and a slave portion of the flip-flop, which portions are not explicitly shown in FIG. 2, to an output of the flip-flop. A retention signal 228 is driven active or placed in an active state (e.g., is asserted) to cause at least some flip-flop data to be retained during a power collapse. An active retention signal 228 causes (e.g., triggers) the power management circuitry 216 to power multiplex at least a slave portion of the flip-flop 206 or to activate a retention feature of the flip-flop 206. It should be understood that the retention signal 228 is not limited to a single trace on an integrated circuit. Alternatively, the retention signal 228 may be implemented as multiple wires on an integrated circuit, as a control sequence that initiates or manipulates actions of the power management circuitry 216, as part of software or firmware signaling that facilitates power management functionality, as additional hardware logic that handles power-down functionality, some combination thereof, and so forth.

In one or more embodiments, the PMIC 210 is configured to supply steady voltages to power rails at particular voltage levels through voltage conversion or voltage regulation using at least one power supply, such as by using two switched-mode power supplies, for example. The PMIC 210 powers the first power rail 202 via the first switched-mode power supply 212 and the second power rail 204 via the second switched-mode power supply 214. The voltage outputs of the first switched-mode power supply 212 and the second switched-mode power supply 214 are controlled by the PMIC 210. The first switched-mode power supply 212 produces the first voltage 222 and holds the first power rail 202 at the first voltage 222. The second switched-mode power supply 214 produces the second voltage 224 and holds the second power rail 204 at the second voltage 224.

A single flip-flop 206 is explicitly illustrated. However, flip-flops may actually be distributed around the data retention circuitry 200 at various locations at which data is to be stored for different computing tasks. A flip-flop may be disposed on the data retention circuitry 200 alone, or multiple flip-flops may be disposed together. Flip-flops may also be disposed together in an operational group, which may be called a flip-flop tray or simply a flop tray. A flip-flop tray may share circuitry or control signaling among multiple flip-flops, such as circuitry that enables scan testing of an IC or that facilitates power management. A total number of flip-flops in a flip-flop tray may be 2, 4, 8, 10, 16, 17, 32, and so forth. Flip-flops that are clocked operate at least partially responsive to the clock signal 226. Retention flip-flops operate at least partially responsive to a state of the retention signal 228. A flip-flop, including a retention flip-flop, may comprise a reset flip-flop or a settable flip-flop, or neither.

The volatile memory 208 comprises a type of memory that relies on power being provided to the memory to maintain stored contents. Without power, the contents stored by the volatile memory 208 dissipates over time. An example of volatile memory 208 is SRAM. By way of example only, the second switched-mode power supply 214, in conjunction with the second power rail 204, provides the second voltage 224 to the volatile memory 208 to maintain the data contents of the memory. However, the second switched-mode power supply 214 or the second power rail 204 may be coupled to one or more other circuit components instead of or in addition to a memory component.

In one or more embodiments, the power management circuitry 216, in conjunction with the PMIC 210, separates operation of the data retention circuitry 200 into at least two modes: a regular operational mode and a retention operational mode. The retention operational mode is a relatively lower power consumption mode in comparison with the regular operational mode. The PMIC 210 powers and holds the first power rail 202 and the second power rail 204 at some voltage for the regular operational mode via the first switched-mode power supply 212 and the second switched-mode power supply 214, respectively. For a retention operational mode, the second switched-mode power supply 214 powers and holds the second power rail 204 at some voltage. In contrast, power may be removed from the first power rail 202 for the retention operational mode. For example, the power collapse circuitry 218 may turn off power to the first switched-mode power supply 212 for the retention operational mode. The slave portion of the flip-flop 206, which is not explicitly shown in FIG. 2, and the digital combinatorial logic 230 may be coupled to the first power rail 202 for both the regular operational mode and the retention operational mode.

The data retention circuitry 200 may transition from the regular operational mode to the retention operational mode and from the retention operational mode to the regular operational mode based at least partly on a state of the retention signal 228. As explained below with particular reference to FIG. 3, the power multiplexing circuitry 220 multiplexes the slave portion of the flip-flop 206, which is not shown in FIG. 2, to the first power rail 202 for the regular operational mode and to the second power rail 204 for the retention operational mode.

Although the PMIC 210 is shown as part of the data retention circuitry 200, the PMIC 210 may be internal to or external of the same IC or ICs as that of the data retention circuitry 200. Also, the power management circuitry 216, or a part thereof, may share circuitry with or be implemented as part of the PMIC 210, or vice versa.

Figure 3:
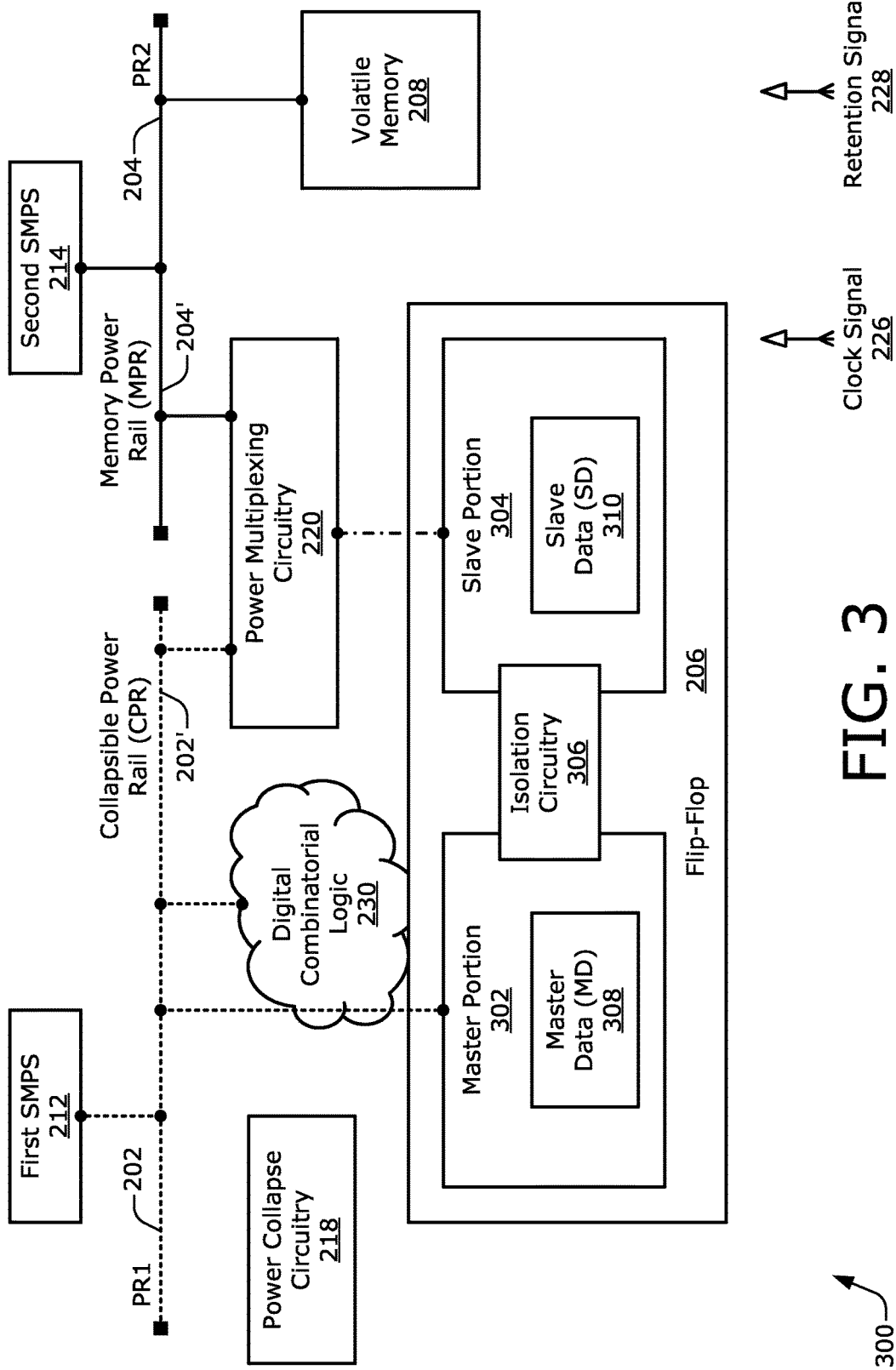
FIG. 3 depicts an example flip-flop including a master portion and a slave portion as well as power multiplexing circuitry that is coupled to the slave portion.

FIG. 3 depicts an example power multiplexing arrangement 300 including a flip-flop 206 having a master portion 302 and a slave portion 304 as well as power multiplexing circuitry 220 that is coupled to the slave portion 304. As illustrated, the power multiplexing arrangement 300 includes the first power rail 202, the second power rail 204, an example implementation of the flip-flop 206, the power collapse circuitry 218, the power multiplexing circuitry 220, the volatile memory 208, and the digital combinatorial logic 230. The power multiplexing arrangement 300 further includes multiple control signals, such as the clock signal 226 and the retention signal 228. The flip-flop 206 includes the master portion 302, the slave portion 304, and isolation circuitry 306. The master portion 302 includes master data 308 (MD), and the slave portion 304 includes slave data 310 (SD).

As shown, the first power rail 202 is coupled to the first switched-mode power supply 212, and the second power rail 204 is coupled to the second switched-mode power supply 214. The master portion 302 and the digital combinatorial logic 230 are coupled to the first power rail 202. The volatile memory 208 is coupled to the second power rail 204. The power multiplexing circuitry 220 is coupled to the first power rail 202 and the second power rail 204. The slave portion 304 is coupled to the power multiplexing circuitry 220. The power multiplexing circuitry 220 selectively couples the slave portion 304 to the first power rail 202 or to the second power rail 204.

In one or more embodiments, the slave portion 304 is powered by a same power rail as the master portion 302 during the regular operational mode. However, the slave portion 304 is powered by a different power rail than the master portion 302 during the retention operational mode. More specifically, the master portion 302 is coupled to, and powered by, the first power rail 202 for the regular operational mode. The master portion 302 is coupled to the first power rail 202 for the retention operational mode also. In contrast, the slave portion 304 is coupled to, and powered by, the first power rail 202 during the regular operational mode. But the slave portion 304 is coupled to, and powered by, the second power rail 204 during the retention operational mode.

The power multiplexing circuitry 220 is configured to couple the slave portion 304 to the first power rail 202 for the regular operational mode and to the second power rail 204 for the retention operational mode. The power multiplexing circuitry 220 is also configured to decouple the slave portion 304 from the first power rail 202 for the retention operational mode and to decouple the slave portion 304 form the second power rail 204 for the regular operational mode. The master portion 302 and the digital combinatorial logic 230 are configured to experience a power collapse for the retention operational mode. The master portion 302 may relinquish the master data 308 during the retention operational mode due to the power collapse. The slave portion 304 is configured to retain the slave data 310 stored by the slave portion 304 for the retention operational mode. The power multiplexing circuitry 220 provides means for power multiplexing the slave portion 304 to the first power rail 202 for the regular operational mode and to the second power rail 204 for the retention operational mode.

The isolation circuitry 306 is configured to isolate the master portion 302 from the slave portion 304, including for the retention operational mode if the properly controlled as described herein. The power collapse circuitry 218 is configured to establish a retention state of the isolation circuitry 306 to prevent the master portion 302 from changing the slave data 310 stored by the slave portion 304 during the retention operational mode. The power collapse circuitry 218 and the use of the isolation circuitry 306 to support power collapse are described further herein with particular reference to FIGS. 8-10. It should be understood that the isolation circuitry 306 of the flip-flop 206 is illustrated separately from the master portion 302 and the slave portion 304 as an example only. The isolation circuitry 306, or one or more circuit devices thereof, may alternatively be part of the master portion 302 or the slave portion 304. The isolation circuitry 306 provides means for isolating the slave portion 304 from the master portion 302 for the retention operational mode if the isolation circuitry 306 is placed in and maintained in an isolating state for the retention operational mode as described herein below, including with particular reference to FIGS. 8-10.

The first power rail 202 may comprise a collapsible power rail 202' (CPR) that undergoes power collapse for the retention operational mode. The power collapse circuitry 218 is configured to remove power from the collapsible power rail 202' for the retention operational mode as is discussed further herein below. The second power rail 204 may comprise a memory power rail 204' (MPR) that sustains some voltage level during the retention operational mode. The volatile memory 208 is coupled to, and powered by, the memory power rail 204' for the regular operational mode and for the retention operational mode for implementations in which the second power rail 204 comprises the memory power rail 204'. The voltage level that is sustained by the memory power rail 204' during the retention operational mode is sufficient to maintain the data contents stored by the volatile memory 208.

Figure 4:
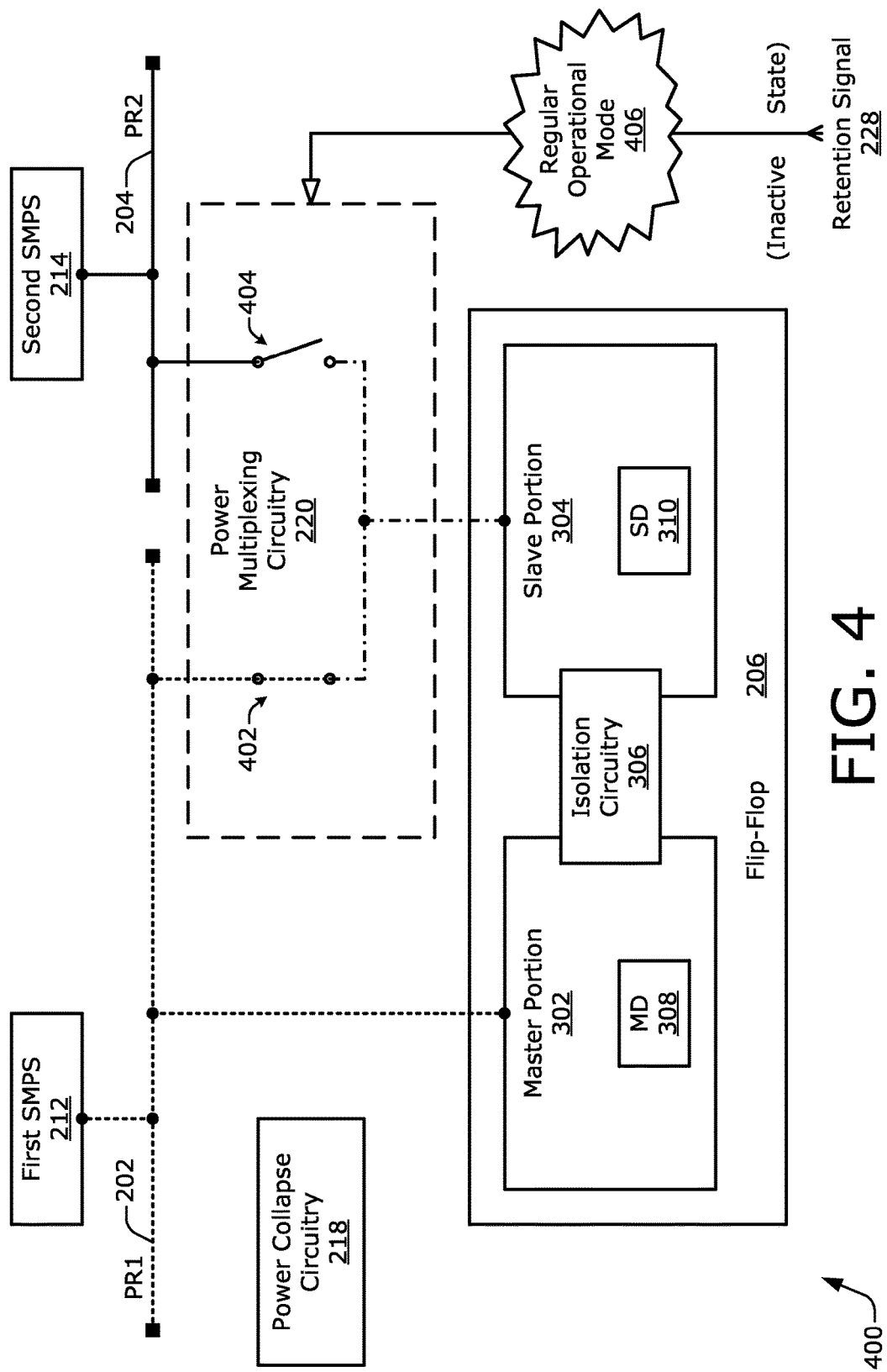
FIG. 4 illustrates an example of power multiplexing circuitry for a regular operational mode of an integrated circuit.
Figure 5:
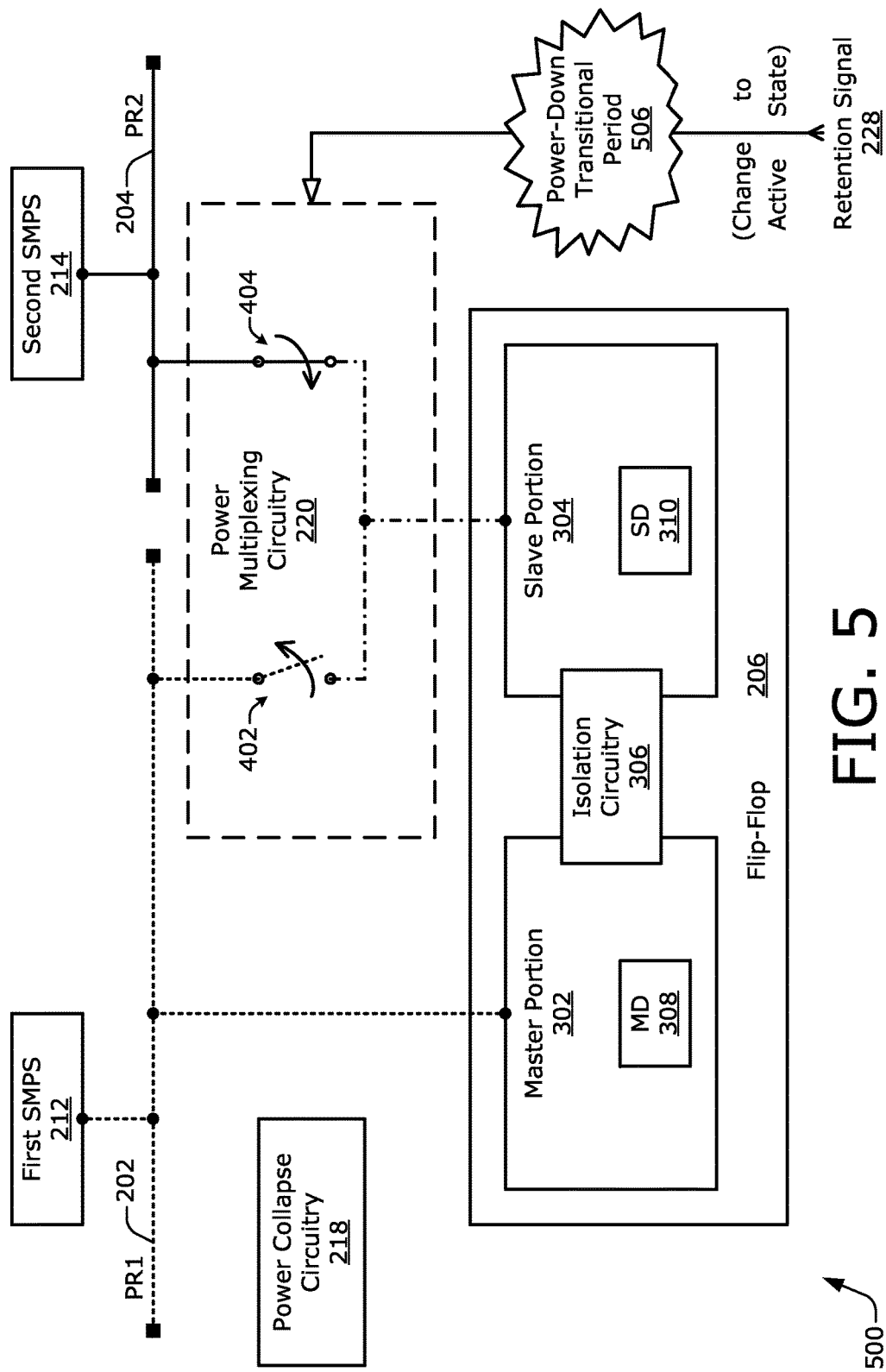
FIG. 5 illustrates an example of power multiplexing circuitry for a power-down transitional period of the integrated circuit.
Figure 6:
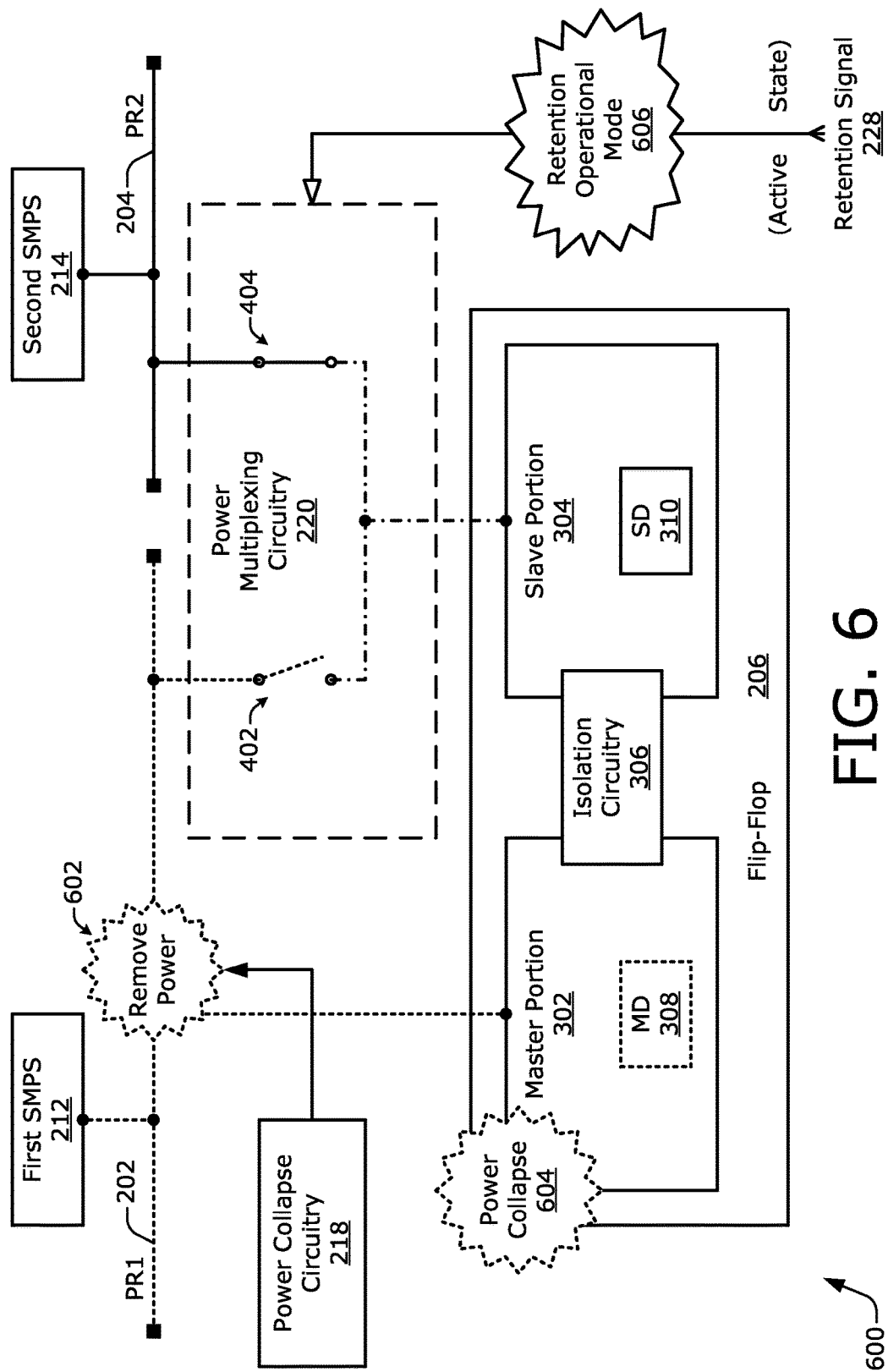
FIG. 6 illustrates an example of power multiplexing circuitry for a retention operational mode of the integrated circuit.
Figure 7:
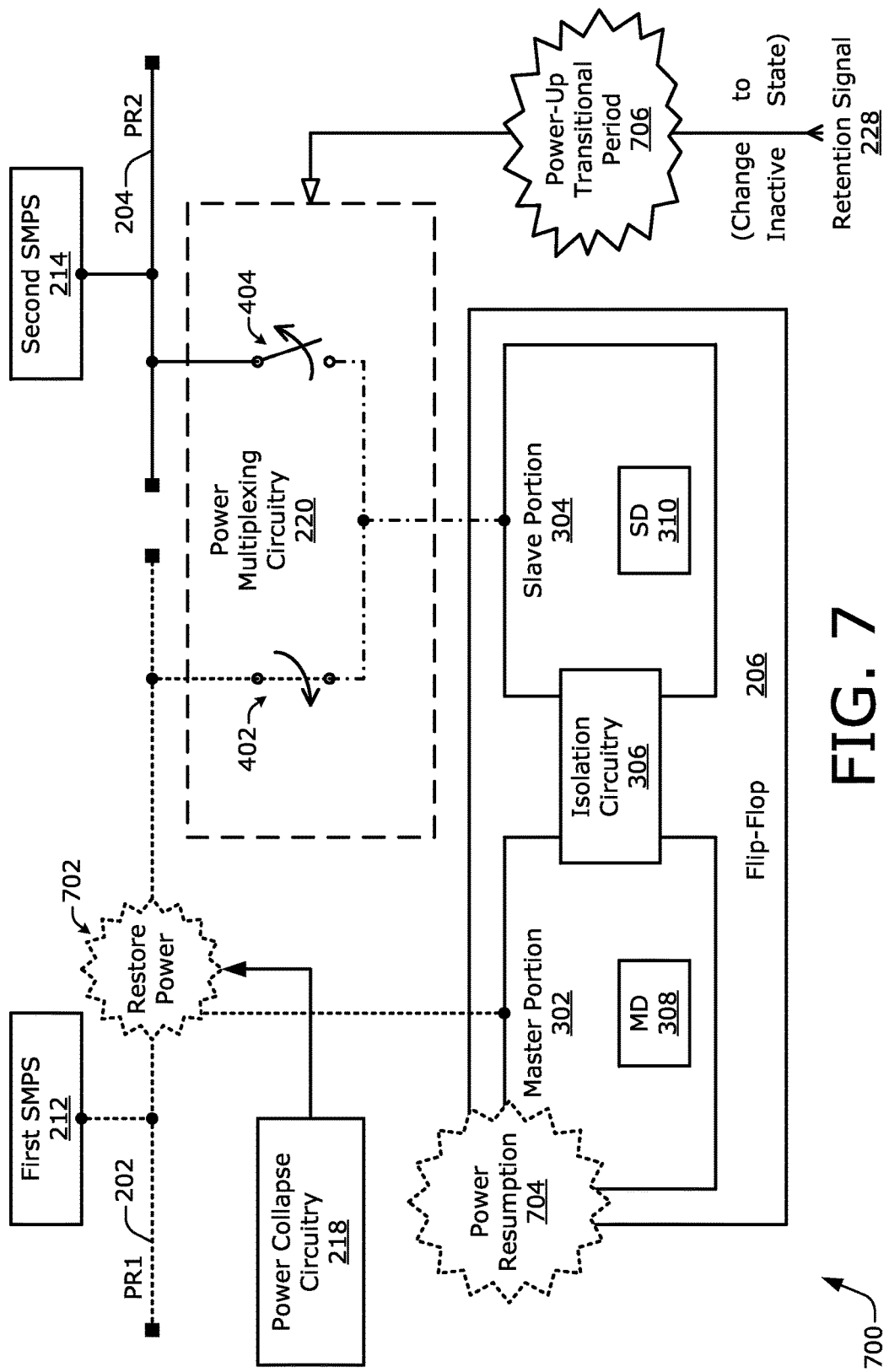
FIG. 7 illustrates an example of power multiplexing circuitry for a power-up transitional period of the integrated circuit.
Figure 8:
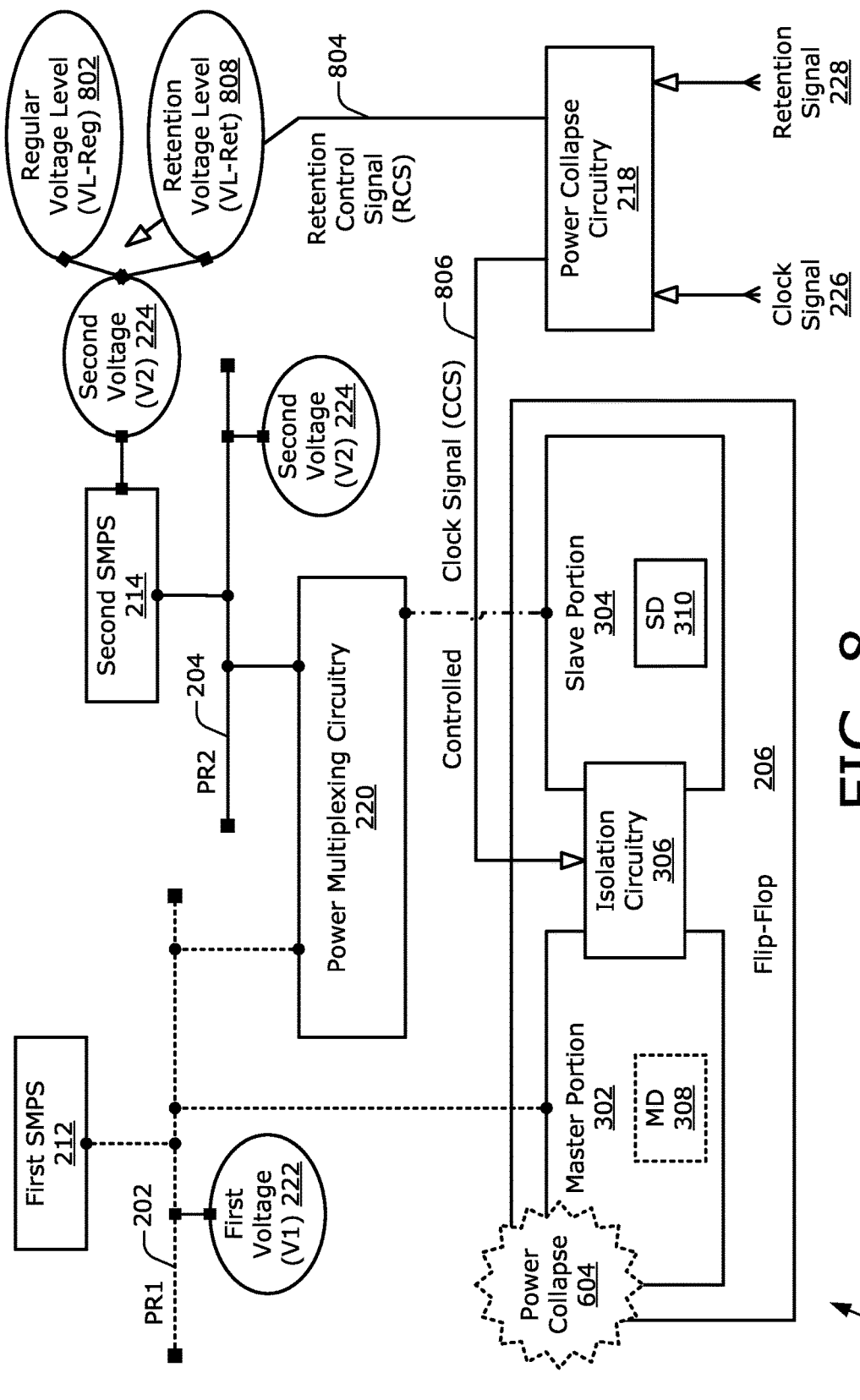
FIG. 8 illustrates some example aspects of the power-down and power-up transitional periods and some example aspects of the retention operational mode of the integrated circuit.

FIGS. 4-7 illustrate different operational modes and different transitional periods between operational modes for data retention circuitry. For an example chronological order of operational modes, data retention circuitry in a regular operational mode transitions to a retention operational mode via a power-down transitional period. To return to the regular operational mode from the retention operational mode, the data retention circuitry goes through a power-up transitional period. An example scenario for the regular operational mode 406 is illustrated in FIG. 4. FIG. 5 illustrates an example of the power-down transitional period 506 that occurs after the regular operational mode and before the retention operational mode. An example scenario for the retention operational mode 606 is illustrated in FIG. 6. FIG. 7 illustrates an example of the power-up transitional period 706 that occurs if the data retention circuitry is transitioning from the retention operational mode back to the regular operational mode. FIG. 8 illustrates additional example aspects of the retention operational mode and additional example aspects of both transitional periods.

For each of FIGS. 4-8, the first switched-mode power supply 212 is shown coupled to the first power rail 202, and the second switched-mode power supply 214 is shown coupled to the second power rail 204. The flip-flop 206 is depicted as including the master portion 302, the slave portion 304, and the isolation circuitry 306. The master portion 302 is associated with the master data 308, and the slave portion is associated with the slave data 310. The power collapse circuitry 218 and the power multiplexing circuitry 220 are also depicted. However, additional example aspects of at least the power collapse circuitry 218 and the power multiplexing circuitry 220 are illustrated and described below with reference to individual ones of FIGS. 4-7.

The illustrated components are interrelated as described above with reference to FIG. 3. For example, the master portion 302 is coupled to the first power rail 202, and the slave portion 304 is coupled to the power multiplexing circuitry 220. The power multiplexing circuitry 220 is coupled to both the first power rail 202 and the second power rail 204. The retention signal 228 is applied to the power multiplexing circuitry 220 to at least partially establish an operational mode responsive to a state of the retention signal 228 or to at least partially trigger a transitional period responsive to a change of the state of the retention signal 228. An active state, an inactive state, and changes of state for the retention signal 228 are described below with particular reference to individual ones of FIGS. 4-7.

In one or more embodiments, as is shown in FIGS. 4-7, the power multiplexing circuitry 220 is implemented to include two switches. The power multiplexing circuitry 220 includes a first switch 402 and a second switch 404. The first switch 402 or the second switch 404 may be implemented, for example, as at least one transistor or as a pass or transmission gate. The first switch 402 is coupled to the first power rail 202 and to the slave portion 304 of the flip-flop 206. The second switch 404 is coupled to the second power rail 204 and to the slave portion 304. The first switch 402 and the second switch 404 provide means for switching between coupling the slave portion 304 to the first power rail 202 and coupling the slave portion 304 to the second power rail 204. Without switching, the master portion 302 of the flip-flop 206 is configured to receive power supplied by the first switched-mode power supply 212 for the regular operational mode 406 and for the retention operational mode 606. With switching, the slave portion 304 of the flip-flop 206 is configured to receive power supplied by the first switched-mode power supply 212 for the regular operational mode 406 and to receive power supplied by the second switched-mode power supply 214 for the retention operational mode 606.

Each of the first switch 402 and the second switch 404 may be in an open state or a closed state. Whether a respective switch couples the slave portion 304 to a respective power rail is based on whether the respective switch is open or closed. If the first switch 402 is in a closed state, the first switch 402 couples the slave portion 304 to the first power rail 202. If the first switch 402 is in an open state, the slave portion 304 is not coupled to the first power rail 202. If the second switch 404 is in a closed state, the second switch 404 couples the slave portion 304 to the second power rail 204. If the second switch 404 is in an open state, the slave portion 304 is not coupled to the second power rail 204.

Different operational modes are established based at least partially on a state of the first switch 402 or a state of the second switch 404 as is described in detail below with reference to FIGS. 4-7. Generally, the power multiplexing circuitry 220 can be configured to close the first switch 402 and open the second switch 404 for the regular operational mode 406 and to open the first switch 402 and close the second switch 404 for the retention operational mode 606.

Different transitional periods occur based at least partially on how the first switch 402 or the second switch 404 is changing states.

FIG. 4 illustrates, generally at 400, an example of the power multiplexing circuitry 220 for the regular operational mode 406 of an integrated circuit. The retention signal 228 is in an inactive state. For example, the retention signal 228 may have a low voltage level (e.g., ground). The inactive state of the retention signal 228 signals that the regular operational mode 406 is to be established or that the data retention circuitry is to be operating in the regular operational mode 406. The retention signal 228 in the inactive state is provided to the power multiplexing circuitry 220, such as by a retention signal tree, which is not shown.

In one or more embodiments, the power multiplexing circuitry 220 couples the slave portion 304 to the first power rail 202 responsive to the inactive state of the retention signal 228 for the regular operational mode 406. More specifically, to establish the regular operational mode 406, the first switch 402 is in a closed state, and the second switch 404 is in an open state. Placing the two switches in these states is discussed further herein below for the power-up transitional period 706 of FIG. 7. Hence, the first switch 402 couples the slave portion 304 to the first power rail 202, but the second switch 404 does not couple the slave portion 304 to the second power rail 204. For the regular operational mode 406, the master portion 302 is coupled to the first power rail 202.

FIG. 5 illustrates, generally at 500, an example of the power multiplexing circuitry 220 for the power-down transitional period 506 of the integrated circuit. The retention signal 228 changes from the inactive state of the regular operational mode 406 of FIG. 4 to the active state of the retention operational mode 606 of FIG. 6. For example, the retention signal 228 may change from a low voltage to a high voltage. The change of the retention signal 228 from the inactive state to the active state triggers the power-down transitional period 506 in which at least a portion of the IC is to be powered down to reduce energy consumption and save power.

For the power-down transitional period 506, the retention signal 228 can be provided to the power multiplexing circuitry 220 as the retention signal 228 changes from the inactive state to the active state. In response, the first switch 402 transitions from a closed state to an open state, and the second switch 404 transitions from an open state to a closed state, as indicated by the two curved movement arrows. The second switch 404 may be closed before the first switch 402 is opened. It should be noted that the retention signal 228 is not limited to a single trace on an integrated circuit. Alternatively, the retention signal 228 may be implemented as multiple wires on an integrated circuit, as a control sequence that initiates or manipulates actions of the power multiplexing circuitry 220, as part of software or firmware signaling that facilitates power management functionality, as additional hardware logic that handles power-down functionality, some combination thereof, and so forth.

FIG. 6 illustrates, generally at 600, an example of the power multiplexing circuitry 220 for the retention operational mode 606 of the integrated circuit. The retention signal 228 is in an active state. For example, the retention signal 228 may have been driven or may be driven to a high voltage level. The active state of the retention signal 228 signals that the retention operational mode 606 is to be established or that the data retention circuitry is to be operating in the retention operational mode 606. The retention signal 228 in the active state is provided to the power multiplexing circuitry 220.

In one or more embodiments, the power multiplexing circuitry 220 couples the slave portion 304 to the second power rail 204 responsive to the active state of the retention signal 228 for the retention operational mode 606. More specifically, to establish the retention operational mode 606, the first switch 402 is in an open state, and the second switch 404 is in a closed state. Placing the two switches in these states is discussed further herein above for the power-down transitional period 506 of FIG. 5. Hence, the second switch 404 couples the slave portion 304 to the second power rail 204, but the first switch 402 does not couple the slave portion 304 to the first power rail 202. The slave portion 304 receives power from the second switched-mode power supply 214 via the second power rail 204 and the second switch 404.

For the retention operational mode 606, the master portion 302 remains coupled to the first power rail 202. The power collapse circuitry 218 removes power from the first power rail 202 as indicated at an action 602. For example, the power collapse circuitry 218 may cause the first switched-mode power supply 212 to turn off and therefore cease providing power to the first power rail 202. The power collapse circuitry 218 provides means for collapsing power that is configured to cause the first switched-mode power supply 212 to cease supplying power for the retention operational mode 606. Alternatively, a switch, which is not shown, coupled between the first switched-mode power supply 212 and the first power rail 202 may be opened to remove power from the first power rail 202 for the retention operational mode 606. The power collapse circuitry 218, in conjunction with the first switched-mode power supply 212 or a switch coupled between the first switched-mode power supply 212 and the first power rail 202, provides means for removing power from the first power rail 202 for the retention operational mode 606.

As a result of the power collapse circuitry 218 removing power from the first power rail 202, the first power rail 202 undergoes a power collapse. The master portion 302, as well as other circuitry coupled to the first power rail 202, therefore experiences a power collapse 604. As charge dissipates in the circuitry of the master portion 302 and voltages drop, the master portion 302 relinquishes the master data 308, and the content thereof is lost. As discussed below with particular reference to FIGS. 8-10, the isolation circuitry 306 prevents the power collapse 604 from changing the slave data 310.

The state of being in a power collapse for the master portion 302 is described in terms of occurring during the retention operational mode 606. Furthermore, the power removal of the action 602 and the resulting power collapse 604 are discussed herein as being part of the retention operational mode 606. However, this discussion is by way of example only so as to facilitate an understanding of the overall power multiplexing process. The power removal of the action 602 or the resulting power collapse 604 may alternatively be considered to start or to be completed during the power-down transitional period 506 of FIG. 5 after the second switch 404 is closed and the first switch 402 is opened.

FIG. 7 illustrates, generally at 700, an example of the power multiplexing circuitry 220 for the power-up transitional period 706 of the integrated circuit. The retention signal 228 changes from the active state of the retention operational mode 606 of FIG. 6 to the inactive state of the regular operational mode 406 of FIG. 4. For example, the retention signal 228 may change from a high voltage to a low voltage. The change of the retention signal 228 from the active state to the inactive state triggers the power-up transitional period 706 in which at least a portion of the IC is being powered up to increase a processing capability and resume one or more computing tasks.

For the power-up transitional period 706, the retention signal 228 can be provided to the power multiplexing circuitry 220 as the retention signal 228 changes from the active state to the inactive state. In response, the first switch 402 transitions from an open state to a closed state, and the second switch 404 transitions from a closed state to an open state, as indicated by the two curved movement arrows. The first switch 402 may be closed before the second switch 404 is opened.

In one or more embodiments for the power-up transitional period 706, the power collapse circuitry 218 restores power to the first power rail 202 as indicated at an action 702 before the second switch 404 is opened. Power may also be restored to the first power rail 202 prior to when the first switch 402 is closed. For example, the power collapse circuitry 218 may cause the first switched-mode power supply 212 to turn on and therefore restore power to the first power rail 202. Alternatively, a switch (not shown) that is coupled between the first switched-mode power supply 212 and the first power rail 202 may be closed to restore power to the first power rail 202 for the regular operational mode 406 of FIG. 4.

As a result of the power collapse circuitry 218 restoring power to the first power rail 202, the first power rail 202 is again held at some voltage by the first switched-mode power supply 212. The master portion 302, as well as other circuitry coupled to the first power rail 202, therefore experiences a power resumption 704. As current flows into the circuitry of the master portion 302 and voltages rise, the master portion 302 is again able to accept and store a value for the master data 308. The power restoration of the action 702 and the resulting power resumption 704 are discussed herein as being part of the power-up transitional period 706. However, this discussion is by way of example only so as to facilitate an understanding of the overall power multiplexing process. The power restoration of the action 702 or the resulting power resumption 704 may alternatively be considered to start or to be completed during the regular operational mode 406 of FIG. 4.

FIG. 8 illustrates, generally at 800, example aspects for a transitional period or for a retention operational mode of an integrated circuit. FIG. 8 additionally depicts the first voltage 222, the second voltage 224, and the clock signal 226. FIG. 8 also includes a regular voltage level 802 (VL-Reg), a retention control signal 804 (RCS), a controlled clock signal 806 (CCS), and a retention voltage level 808 (VL-Ret). As shown, the power collapse circuitry 218 receives as inputs the clock signal 226 and the retention signal 228 and produces as outputs the retention control signal 804 and the controlled clock signal 806.

First, example aspects are shown for two transitional periods, such as the power-down transitional period 506 of FIG. 5 or the power-up transitional period 706 of FIG. 7. In FIG. 8, the first power rail 202 is shown corresponding to the first voltage 222, and the second power rail 204 is shown corresponding to the second voltage 224. For example, the first switched-mode power supply 212 is configured to hold the first power rail 202 at the first voltage 222 if the first power rail 202 is not collapsed. The second switched-mode power supply 214 is configured to hold the second power rail 204 at the second voltage 224. The PMIC 210 of FIG. 2 can be configured to maintain the second voltage 224 at a higher level than the first voltage 222 during at least the two identified transitional periods via the second switched-mode power supply 214 and the first switched-mode power supply 212, respectively. Maintaining the second voltage 224 at a higher level than the first voltage 222 ensures that the isolation circuitry 306 is capable of separating the master portion 302 from the slave portion 304 without permitting appreciable leakage currents to develop due to the isolation circuitry 306. The pertinence of relative voltage levels between the first voltage 222 and the second voltage 224 will become more apparent from the description of FIG. 10 below.

Second, example aspects are shown for the retention operational mode 606 of FIG. 6 during which the master portion 302 experiences the power collapse 604 and the slave portion 304 is powered by the second switched-mode power supply 214 via the second power rail 204. An output voltage of the second switched-mode power supply 214 is shown as the second voltage 224. The second switched-mode power supply 214 holds the second power rail 204 at the second voltage 224. The second switched-mode power supply 214 can be configured to produce the output voltage at multiple levels, such as the regular voltage level 802 and the retention voltage level 808. Hence, the second voltage 224 may comprise the regular voltage level 802 or the retention voltage level 808.

In operation, responsive to the retention signal 228 being in the inactive state, the power collapse circuitry 218 causes the output voltage of the second switched-mode power supply 214 to be at the regular voltage level 802 using the retention control signal 804. For instance, the retention control signal 804 may be provided to the PMIC 210 of FIG. 2 or the second switched-mode power supply 214 to maintain the regular voltage level 802 for the regular operational mode 406 of FIG. 4. Responsive to the retention signal 228 being in the active state, on the other hand, the power collapse circuitry 218 causes the output voltage of the second switched-mode power supply 214 to be at the retention voltage level 808 using the retention control signal 804. For instance, the retention control signal 804 may be provided to the PMIC 210 of FIG. 2 or the second switched-mode power supply 214 to maintain the retention voltage level 808 for the retention operational mode 606 of FIG. 6.

The regular voltage level 802 can be higher than the retention voltage level 808. Hence, the power collapse circuitry 218 can be configured to decrease the output voltage of the second switched-mode power supply 214 from the regular voltage level 802 to the retention voltage level 808 using the retention control signal 804 for the retention operational mode 606. For example, the regular voltage level 802 may be sufficiently high to read, write, and maintain data in a volatile memory, such as the volatile memory 208 of FIG. 3. The retention voltage level 808, on the other hand, may be sufficiently high to maintain the data in the volatile memory, but insufficiently high to enable reading from or writing to the data in the volatile memory. The retention voltage level 808 is also sufficiently high to maintain the value of the slave data 310 of the slave portion 304.

In addition to the aspects discussed above, FIG. 8 illustrates aspects of power collapse management for the flip-flop 206. In one or more embodiments, the power collapse circuitry 218 produces the controlled clock signal 806 based on the clock signal 226 and responsive to the retention signal 228. The power collapse circuitry 218 is configured to provide the controlled clock signal 806 to the flip-flop 206. The clock signal 226 is controlled such that the controlled clock signal 806 causes the isolation circuitry 306 to isolate the slave portion 304 from the master portion 302. More specifically, responsive to receipt of the controlled clock signal 806, the flip-flop 206 is configured to isolate the master portion 302 from the slave portion 304 to retain the slave data 310 at an output of the slave portion 304 during the power collapse 604, as is described in more detail below. Retention of the slave data 310 is described below with particular reference to FIG. 10.

The power collapse circuitry 218 can be configured to clamp the controlled clock signal 806 at a constant value, such as zero or one, during the power collapse 604 responsive to a state of the retention signal 228. More specifically, the clamping may be performed responsive to an active state of the retention signal 228. Further discussion of generating and maintaining the controlled clock signal 806 is provided below with particular reference to FIG. 9.

Figure 9:
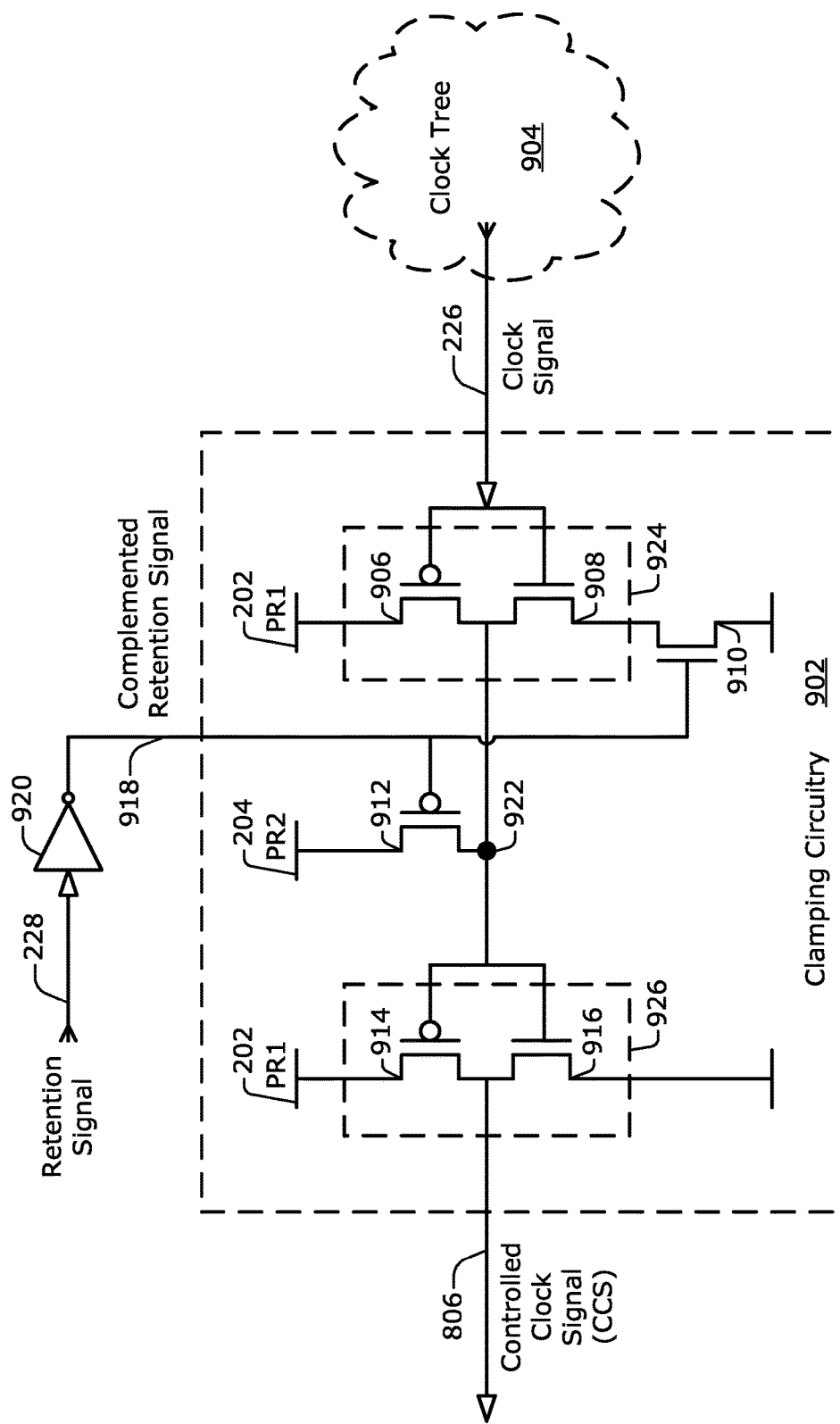
FIG. 9 depicts example clamping circuitry to produce a controlled clock signal that is provided to a flip-flop having a retention feature.
Figure 10:
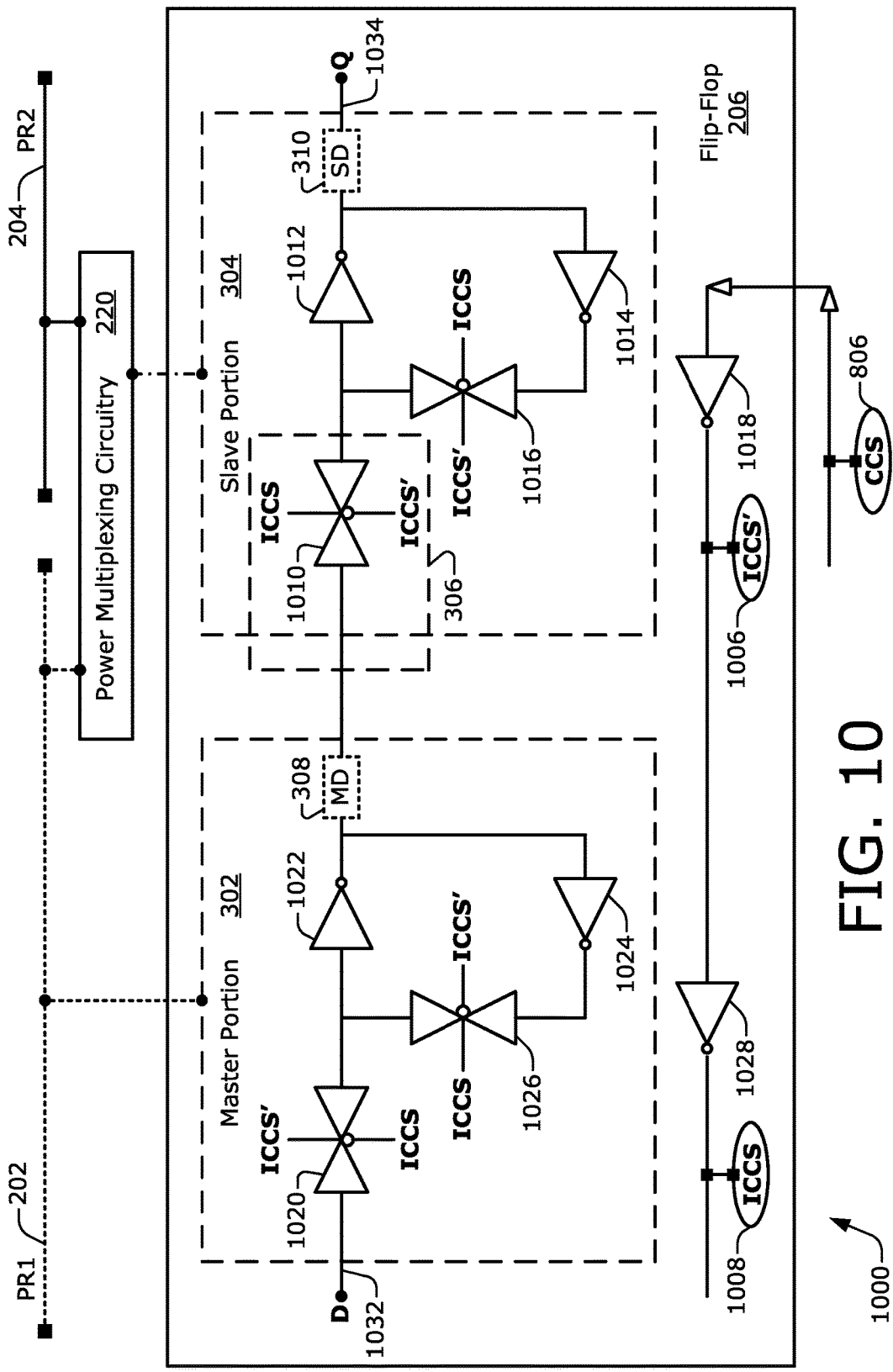
FIG. 10 depicts an example flip-flop including a master portion and a slave portion that receives the controlled clock signal.

FIG. 9 depicts, generally at 900, example clamping circuitry 902 to produce the controlled clock signal 806 (CCS) that is provided to a flip-flop having a retention feature, such as the flip-flop 206 of FIGS. 3, 8, and 10. The clamping circuitry 902 may comprise at least part of the power collapse circuitry 218 of FIG. 8. FIG. 9 includes a clock tree 904, the clock signal 226, the retention signal 228, an inverter 920, a complemented retention signal 918, the clamping circuitry 902, and the controlled clock signal 806. As illustrated, the clamping circuitry 902 includes: two power rails—the first power rail 202 (PR1) and the second power rail 204 (PR2); two inverters—an input inverter 924 and an output inverter 926; six transistors—a transistor 906, a transistor 908, a transistor 910, a transistor 912, a transistor 914, and a transistor 916; and a node 922. The clock tree 904 propagates and distributes a periodic clock signal to different areas of an IC. The inverter 920 inverts the retention signal 228 to produce the complemented retention signal 918.

The clamping circuitry 902 can terminate a branch of the clock tree 904 and provides a version of the clock signal 226, such as the controlled clock signal 806, to other circuitry, such as one or more flip-flops. The clamping circuitry 902 receives the clock signal 226 and a version of the retention signal 228, namely the complemented retention signal 918, as input and produces the controlled clock signal 806 as output. In an example operation, the clamping circuitry 902 forwards periodic pulses of the clock signal 226 as the controlled clock signal 806 responsive to an inactive state of the retention signal 228. If the retention signal 228 is in an active state (e.g., a high voltage or "one"), on the other hand, the clamping circuitry 902 clamps the clock signal 226 to a particular voltage value, such as a low voltage (e.g., ground), and forwards the particular voltage value as the controlled clock signal 806. The controlled clock signal 806 is clamped to the particular voltage value for the retention operational mode 606 of FIG. 6, and the particular voltage value is provided to the isolation circuitry 306 of FIGS. 8 and 10. The clamping circuitry 902 provides means for clamping a clock signal 226 to prevent master data 308 of FIG. 8 of the master portion 302 from changing the slave data 310 of the slave portion 304.

An example of the clamping circuitry 902 includes a number of circuit devices. The transistors are each shown as a field effect transistor (FET). However, one or more of the transistors may be implemented using alternative technology, such as a bipolar junction transistor (BJT). Each of the transistor 906, the transistor 912, and the transistor 914 comprise a p-type FET (PFET). Each of the transistor 908, the transistor 910, and the transistor 916 comprise an n-type FET (NFET). Each inverter includes two transistors. The input inverter 924 includes the transistor 906 and the transistor 908. The output inverter 926 includes the transistor 914 and the transistor 916.

From right to left, the transistor 906 and the transistor 908 operate jointly as the input inverter 924. The transistor 906 and the transistor 908 are coupled between the first power rail 202 and the transistor 910. The transistor 910 is also coupled to ground. An input of the input inverter 924 receives the clock signal 226. The transistor 912 is coupled between the second power rail 204 and the node 922. The node 922 corresponds to an output of the input inverter 924. The gate terminal of the transistor 912 and the gate terminal of the transistor 910 are coupled to the complemented retention signal 918. The transistor 914 and the transistor 916 operate jointly as the output inverter 926. The transistor 914 and the transistor 916 are coupled between the first power rail 202 and the ground. At the node 922, an input of the output inverter 926 is coupled to the output of the input inverter 924. An output of the output inverter 926 provides the controlled clock signal 806.

In an example operation for the clamping circuitry 902, the controlled clock signal 806 is produced responsive to a state of the retention signal 228. If the retention signal 228 is in an inactive state, e.g. at a low voltage level, the complemented retention signal 918 is at a high voltage level. The high voltage level turns off the p-type transistor 912. Consequently, the clock signal 226 is inverted a first time by the input inverter 924 that is formed by the transistor 906 and the transistor 908 and is inverted a second time by the output inverter 926 that is formed by the transistor 914 and the transistor 916. Hence, the controlled clock signal 806 comprises the clock signal 226 if the retention signal 228 is in the inactive state.

On the other hand, if the retention signal 228 is in an active state (e.g., at a high voltage level) as part of the power-down transitional period 506 of FIG. 5 or the retention operational mode 606 of FIG. 6, the complemented retention signal 918 is at a low voltage level. The low voltage level of the complemented retention signal 918 turns on the p-type transistor 912. Consequently, the node 922 is kept at a level of the second voltage 224 of FIG. 8 for the second power rail 204. The second voltage 224 is maintained at some voltage level that is above ground for the regular operational mode 406 and for the retention operational mode 606. If the first voltage 222 of FIG. 8 for the first power rail 202 is still at a functional level as part of the power-down transitional period 506, the output inverter 926 is still functional. Hence, the high voltage level at the node 922 is inverted by the output inverter 926 of the transistor 914 and the transistor 916 such that the controlled clock signal 806 is driven to a low voltage level if the retention signal 228 is in the active state. However, if the first power rail 202 is collapsed for the retention operational mode 606, the output inverter 926 is no longer functional, at least as a traditional inverter. The controlled clock signal 806 is nevertheless driven to a low voltage level during the power collapse because the output of the output inverter 926 is pulled low (e.g., to ground) due to the transistor 916 being turned on by the high voltage level at the node 922. A low voltage level for the controlled clock signal 806 causes the isolation circuitry 306 of FIG. 8 to protect the slave data 310 of the slave portion 304 from a power collapse in the master portion 302 of a flip-flop 206, as is explained below with particular reference to FIG. 10.

FIG. 10 depicts, generally at 1000, an example flip-flop 206 that includes the master portion 302 and the slave portion 304 and that receives the controlled clock signal 806 (CCS) of FIGS. 8 and 9. FIG. 10 also depicts the first power rail 202, the second power rail 204, and the power multiplexing circuitry 220. In addition to the master portion 302 and the slave portion 304, the flip-flop 206 includes an input 1032 "D," an output 1034 "Q," a first inverter 1018, and a second inverter 1028. As shown, the master portion 302 and the slave portion 304 each include two pass gates and two inverters. These eight circuit devices are described below. The master portion 302 also includes the master data 308 (MD) at an output of the master portion 302, and the slave portion 304 includes the slave data 310 (SD) at an output of the slave portion 304.

In one or more embodiments, the master portion 302 and the corresponding slave portion 304 of the flip-flop 206 are arranged in series. The input 1032 of the flip-flop 206 coincides with an input of the master portion 302. The master data 308 is located at the output of the master portion 302. The output of the master portion 302 coincides with an input of the slave portion 304. The slave data 310 is located at the output of the slave portion 304. The output of the slave portion 304 coincides with the output 1034 of the flip-flop 206. The master data 308 of the master portion 302 may be represented by a voltage level at the output of the master portion 302. The slave data 310 of the slave portion 304 may be represented by a voltage level at the output of the slave portion 304.

The master portion 302 and the individual circuit devices thereof are coupled to, and powered by, the first power rail 202. The slave portion 304 and the individual circuit devices thereof are coupled to the power multiplexing circuitry 220. The circuit devices of the slave portion 304 may therefore be powered by the first power rail 202 for the regular operational mode and by the second power rail 204 for the retention operational mode in accordance with the power multiplexing of the power multiplexing circuitry 220.

In an example scenario involving power collapse, power is removed from the first power rail 202 as discussed above with particular reference to FIG. 6. The master portion 302 of the flip-flop 206 is configured to relinquish the master data 308 if power is removed from the first power rail 202. If the master data 308 is relinquished, the voltage level at the output of the master portion 302 begins to drop or drift toward a ground voltage level. The slave portion 304, on the other hand, is configured to retain the slave data 310 if power is removed from the first power rail 202 inasmuch as the slave portion 304 is already multiplexed onto the second power rail 204 by the power multiplexing circuitry 220 at a time of the power removal action. If the slave data 310 is retained during a power collapse event of the retention operational mode, the slave data 310 is available after the power collapse event ends for a subsequent computing task during the regular operational mode without reloading the data from another memory location.

As illustrated, the master portion 302 includes an interface pass gate 1020, a forward inverter 1022, a feedback inverter 1024, and a feedback pass gate 1026. The names of the pass gates and the inverters are assigned merely to facilitate understanding of the principles described herein, and the names are not intended to be limiting. The pass gates of the master portion 302 and of the slave portion 304 may be constructed using at least one FET per pass gate, such as two FETs for each pass gate. Each pass gate includes a negative gate terminal and a positive gate terminal. The negative gate terminal leads to an n-type FET (NFET), and the positive gate terminal leads to a p-type FET (PFET). Pass gates may also be termed transmission gates.

The interface pass gate 1020 enables or disables an input interface for the master portion 302. The forward inverter 1022 is aligned with a direction of data movement or migration across the flip-flop 206, and the feedback inverter 1024 is aligned against a direction of data migration across the flip-flop 206 as part of a feedback path. The feedback inverter 1024 and the feedback pass gate 1026 form part of the feedback path that maintains a current version of the master data 308 at the output of the master portion 302 if the feedback pass gate 1026 is in a closed state.

More specifically, an input of the interface pass gate 1020 coincides with an input of the master portion 302 as well as the input 1032 of the flip-flop 206. An output of the interface pass gate 1020 is coupled to an output of the feedback pass gate 1026 and to an input of the forward inverter 1022. An output of the forward inverter 1022 drives the master data 308 and coincides with the output of the master portion 302. The output of the forward inverter 1022 is coupled to an input of the feedback inverter 1024. An output of the feedback inverter 1024 is coupled to an input of the feedback pass gate 1026. As noted above, the output of the feedback pass gate 1026 is coupled to the output of the interface pass gate 1020 and to the input of the forward inverter 1022, which forms a feedback loop for the master portion 302 if the feedback pass gate 1026 is in a closed state.

As illustrated, the slave portion 304 includes an interface pass gate 1010, a forward inverter 1012, a feedback inverter 1014, and a feedback pass gate 1016. The interface pass gate 1010 enables or disables an input interface for the slave portion 304. The forward inverter 1012 is aligned with a direction of data movement or migration across the flip-flop 206, and the feedback inverter 1014 is aligned against a direction of data migration across the flip-flop 206 as part of a feedback path. The feedback inverter 1014 and the feedback pass gate 1016 form part of the feedback path that maintains a current version of the slave data 310 at the output of the slave portion 304 if the feedback pass gate 1016 is in a closed state.

More specifically, an input of the interface pass gate 1010 coincides with an input of the slave portion 304 as well as the output of the master portion 302. An output of the interface pass gate 1010 is coupled to an output of the feedback pass gate 1016 and to an input of the forward inverter 1012. An output of the forward inverter 1012 drives the slave data 310 and coincides with the output 1034 of the flip-flop 206. The output of the forward inverter 1012 is coupled to an input of the feedback inverter 1014. An output of the feedback inverter 1014 is coupled to an input of the feedback pass gate 1016. As noted above, the output of the feedback pass gate 1016 is coupled to the output of the interface pass gate 1010 and to the input of the forward inverter 1012, which forms a feedback loop for the slave portion 304 if the feedback pass gate 1016 is in a closed state.

As described above with reference to FIGS. 8 and 9, the clamping circuitry 902 of the power collapse circuitry 218 is configured to produce the controlled clock signal 806 (CCS) based on the clock signal 226 and responsive to the retention signal 228. The clamping circuitry 902 is further configured to provide the controlled clock signal 806 to the flip-flop 206 via at least one signal trace. As shown in FIG. 10, the controlled clock signal 806 is provided to the flip-flop 206 at an input of the first inverter 1018.

The first inverter 1018, like the slave portion 304, can be coupled to and powered by the second power rail 204 via the power multiplexing circuitry 220 for the retention operational mode. The second inverter 1028, like the master portion 302, is coupled to and powered by the first power rail 202. An output of the first inverter 1018 is coupled to an input of the second inverter 1028. The first inverter 1018 receives the controlled clock signal 806 and inverts a value of the controlled clock signal 806 to produce a complemented internal controlled clock signal 1006 (ICCS') at the output of the first inverter 1018. The complemented internal controlled clock signal 1006 (ICCS') is provided to the input of the second inverter 1028. The second inverter 1028 inverts a value of the complemented internal controlled clock signal 1006 (ICCS') to produce an internal controlled clock signal 1008 (ICCS) at the output of the second inverter 1028. The complemented internal controlled clock signal 1006 (ICCS') and the internal controlled clock signal 1008 (ICCS) are coupled to separate control terminals of the pass gates, as shown, to control whether each pass gate is open or closed.

For the interface pass gate 1020 and the feedback pass gate 1016, the complemented internal controlled clock signal 1006 (ICCS') is fed to a negative gate terminal, and the internal controlled clock signal 1008 (ICCS) is fed to a positive gate terminal. For the interface pass gate 1010 and the feedback pass gate 1026, the complemented internal controlled clock signal 1006 (ICCS') is fed to a positive gate terminal, and the internal controlled clock signal 1008 (ICCS) is fed to a negative gate terminal. An example operation of the flip-flop 206 is described in terms of positive-edge triggered pass gates; however, a flip-flop 206 may alternatively be implemented with negative-edge triggered circuit devices.

In a data hold state for the regular operational mode, data is not migrated from the master portion 302 to the slave portion 304. For the data hold state, the interface pass gate 1020 and the feedback pass gate 1016 are both closed to permit a signal to be passed, and the feedback pass gate 1026 and the interface pass gate 1010 are both open to prevent a signal from passing. To create these conditions for the data hold state, the complemented internal controlled clock signal 1006 (ICCS') is held at a high value, and the internal controlled clock signal 1008 (ICCS) is held at a low level. In a data migration state for the regular operational mode, data is migrated from the master portion 302 to the slave portion 304. For the data migration state, the interface pass gate 1020 and the feedback pass gate 1016 are both open to prevent a signal from being passed, and the feedback pass gate 1026 and the interface pass gate 1010 are both closed to permit a signal to be passed. To create these conditions for the data migration state, the complemented internal controlled clock signal 1006 (ICCS') is held at a low value, and the internal controlled clock signal 1008 (ICCS) is held at a high level.

In one or more embodiments, the isolation circuitry 306 may comprise part of the slave portion 304 as illustrated. The isolation circuitry 306 is considered as part of the slave portion 304 here because the isolation circuitry 306 is powered in accordance with a multiplexing state of the power multiplexing circuitry 220 like the slave portion 304. An example implementation of the isolation circuitry 306 is a pass gate with control inputs that are properly configured and driven to isolate the slave portion 304 from the master portion 302 during a power collapse event. In FIG. 10, the isolation circuitry 306 is implemented at least partially by the interface pass gate 1010. For the regular operational mode, the interface pass gate 1010 is opened or closed based on a data hold state or a data migration state of the flip-flop 206 as described above. If the flip-flop 206 is migrating the master data 308 of the master portion 302 to be the next slave data 310 of the slave portion 304, the interface pass gate 1010 is closed. If, on the other hand, the flip-flop 206 is not migrating data from the master portion 302 to the slave portion 304, the interface pass gate 1010 is open and the feedback pass gate 1016 is closed to maintain the current slave data 310 using the feedback loop that also includes the feedback inverter 1014.

During a power collapse event for the retention operational mode, to implement a retention feature for the flip-flop 206, the interface pass gate 1010 is kept open to isolate the slave portion 304 from the master portion 302. The feedback pass gate 1016 may be kept closed to ensure that the slave data 310 is retained by the slave portion 304. To place the interface pass gate 1010 in an open state and the feedback pass gate 1016 in a closed state, the complemented internal controlled clock signal 1006 (ICCS') is driven to or maintained at a high voltage level, and the internal controlled clock signal 1008 (ICCS) is driven to, maintained at, or permitted to drift to a low voltage level. To maintain the complemented internal controlled clock signal 1006 (ICCS') and the internal controlled clock signal 1008 (ICCS) at these voltage levels during a power collapse event, the controlled clock signal 806 (CCS) is maintained at a low voltage level during the power collapse event. An example approach to driving or maintaining the controlled clock signal 806 at a low voltage level during a power collapse event is described herein above with particular reference to FIG. 9 for the clamping circuitry 902.

Figure 11:
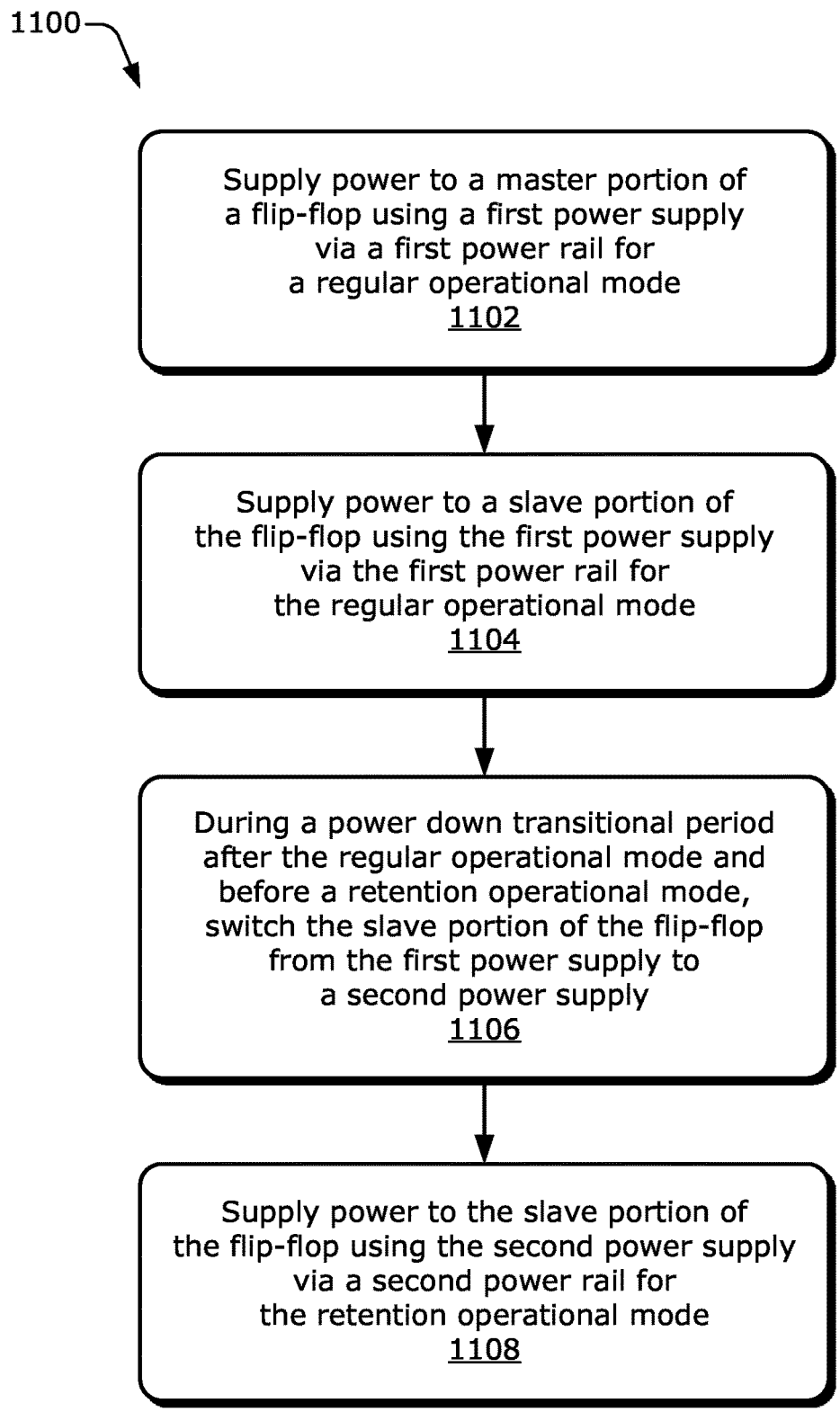
FIG. 11 is a flow diagram illustrating an example process for power multiplexing with flip-flops.

FIG. 11 is a flow diagram illustrating an example process 1100 for power multiplexing with flip-flops. Process 1100 is described in the form of a set of blocks 1102-1108 that specify operations that may be performed. However, operations are not necessarily limited to the order shown in FIG. 11 or described herein, for the operations may be implemented in alternative orders or in fully or partially overlapping manners. Operations represented by the illustrated blocks of process 1100 may be performed by an integrated circuit, such as an integrated circuit 110 of FIG. 1. More specifically, the operations of process 1100 may be performed by the power multiplexing arrangement 300 of FIG. 3 that is part of the data retention circuitry 200 of FIG. 2.

At block 1102, the integrated circuit supplies power to a master portion of a flip-flop using a first power supply via a first power rail for a regular operational mode. For example, part of the data retention circuitry 200, such as a PMIC 210, may supply power to a master portion 302 of a flip-flop 206 using a first power supply, such as a first switched-mode power supply 212, via a first power rail 202 for a regular operational mode 406.

At block 1104, the integrated circuit supplies power to a slave portion of the flip-flop using the first power supply via the first power rail for the regular operational mode. For example, part of the data retention circuitry 200, such as the PMIC 210, may supply power to a slave portion 304 of the flip-flop 206 using the first switched-mode power supply 212 via the first power rail 202 for the regular operational mode 406.

At block 1106, during a power-down transitional period after the regular operational mode and before a retention operational mode, the integrated circuit switches the slave portion of the flip-flop from the first power supply to a second power supply. For example, power multiplexing circuitry 220 may switch the slave portion 304 of the flip-flop 206 from the first switched-mode power supply 212 to a second power supply, such as a second switched-mode power supply 214, during a power-down transitional period 506 after the regular operational mode 406 and before a retention operational mode 606.

In an example implementation of the switching operation of block 1106, the integrated circuit further disconnects the slave portion of the flip-flop from the first power rail and connects the slave portion of the flip-flop to the second power rail. For instance, the power multiplexing circuitry 220 may disconnect the slave portion 304 of the flip-flop 206 from the first power rail 202 and connect the slave portion 304 of the flip-flop 206 to the second power rail 204 during the power-down transitional period 506.

At block 1108, the integrated circuit supplies power to the slave portion of the flip-flop using the second power supply via a second power rail for the retention operational mode. For example, part of the data retention circuitry 200, such as the PMIC 210, may supply power to the slave portion 304 of the flip-flop 206 using the second switched-mode power supply 214 via a second power rail 204 for the retention operational mode 606.

In an example implementation of the process 1100, for the power-down transitional period, the integrated circuit further supplies power to the master portion of the flip-flop using the first switched-mode power supply via the first power rail and supplies power to the slave portion of the flip-flop using the second switched-mode power supply via the second power rail. More specifically, part of the data retention circuitry 200, such as the PMIC 210, may supply power to the master portion 302 of the flip-flop 206 using the first switched-mode power supply 212 via the first power rail 202 and may supply power to the slave portion 304 of the flip-flop 206 using the second switched-mode power supply 214 via the second power rail 204 during the power-down transitional period 506.

In an example implementation of the process 1100, the integrated circuit further turns off the first switched-mode power supply for the retention operational mode. For instance, the power collapse circuitry 218, in conjunction with the PMIC 210, may turn off the first switched-mode power supply 212 for the retention operational mode 606.

In an example implementation of the process 1100, the master portion of the flip-flop experiences a power collapse for the retention operational mode, and the slave portion of the flip-flop retains slave data for the retention operational mode. More specifically, the master portion 302 of the flip-flop 206 may experience a power collapse 604 for the retention operational mode 606, and the slave portion 304 of the flip-flop 206 may retain slave data 310 for the retention operational mode 606.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. Data retention circuitry comprising:
   a first power rail;
   a second power rail;
   a flip-flop including a master portion and a slave portion, the master portion coupled to the first power rail for a regular operational mode and for a retention operational mode, the flip-flop further including isolation circuitry configured to isolate the master portion from the slave portion for the retention operational mode;
   power multiplexing circuitry configured to couple the slave portion to the first power rail for the regular operational mode and to the second power rail for the retention operational mode; and
   power collapse circuitry including clamping circuitry configured to clamp a clock signal responsive to an active state of a retention signal to produce a controlled clock signal;
   wherein the power collapse circuitry is configured to establish a retention state of the isolation circuitry to prevent the master portion from changing slave data stored by the slave portion for the retention operational mode and to provide the controlled clock signal to the isolation circuitry to establish the retention state of the isolation circuitry to prevent the master portion from changing the slave data stored by the slave portion for the retention operational mode.

2. The data retention circuitry of claim 1, wherein:
   the master portion is configured to experience a power collapse for the retention operational mode; and
   the slave portion is configured to retain the slave data stored by the slave portion for the retention operational mode.

3. The data retention circuitry of claim 1, wherein:
   the first power rail comprises a collapsible power rail; and
   the power collapse circuitry is configured to remove power from the collapsible power rail for the retention operational mode.

4. The data retention circuitry of claim 3, wherein:
   the collapsible power rail is coupled to a switched-mode power supply; and
   the power collapse circuitry is further configured to turn off the switched-mode power supply for the retention operational mode.

5. The data retention circuitry of claim 1, wherein the power multiplexing circuitry is further configured to:
   decouple the slave portion from the first power rail during a power-down transitional period that occurs after the regular operational mode and before the retention operational mode; and
   couple the slave portion to the second power rail during the power-down transitional period.

6. The data retention circuitry of claim 5,
   wherein the power collapse circuitry is configured to remove power from the first power rail after the slave portion is decoupled from the first power rail and coupled to the second power rail for the retention operational mode.

7. The data retention circuitry of claim 1, wherein the power multiplexing circuitry is further configured to:
   decouple the slave portion from the second power rail during a power-up transitional period that occurs after the retention operational mode and before the regular operational mode; and
   couple the slave portion to the first power rail during the power-up transitional period.

8. The data retention circuitry of claim 1, wherein the data retention circuitry is configured to:
   hold the first power rail at a first voltage;
   hold the second power rail at a second voltage; and for the retention operational mode, maintain the second voltage at a level that is higher than a level of the first voltage and that is sufficient to meet a retention voltage level of the slave portion.

9. The data retention circuitry of claim 1, further comprising:
a first power supply coupled to the first power rail, the first power supply configured to provide power to the first power rail;
a second power supply coupled to the second power rail, the second power supply configured to provide power to the second power rail, wherein the power collapse circuitry is configured to turn off the first power supply for the retention operational mode.

10. The data retention circuitry of claim 1, further comprising volatile memory coupled to the second power rail.

11. The data retention circuitry of claim 10, wherein:
the second power rail is coupled to a switched-mode power supply, wherein the power collapse circuitry is configured to decrease an output voltage of the switched-mode power supply from a regular voltage level to a retention voltage level for the retention operational mode.

12. The data retention circuitry of claim 1, wherein:
the power multiplexing circuitry comprises:
a first switch coupled between the slave portion of the flip-flop and the first power rail; and
a second switch coupled between the slave portion of the flip-flop and the second power rail; and
the power multiplexing circuitry is further configured to close the first switch and open the second switch for the regular operational mode and to open the first switch and close the second switch for the retention operational mode.

13. Data retention circuitry comprising:
a first power rail;
a second power rail;
a flip-flop including a master portion and a slave portion, the master portion coupled to the first power rail for both a regular operational mode and a retention operational mode, the slave portion configured to retain slave data if the master portion experiences a power collapse for the retention operational mode, the flip flop further including isolation circuitry configured to isolate the master portion from the slave portion for the retention operational mode;
means for power multiplexing the slave portion to the first power rail for the regular operational mode and to the second power rail for the retention operational mode; and
power collapse circuitry including means for clamping a clock signal responsive to an active state of a retention signal to produce a controlled clock signal;
wherein the power collapse circuitry is configured to establish a retention state of the isolation circuitry to prevent the master portion from changing the slave data stored by the slave portion for the retention operational mode and to provide the controlled clock signal to the isolation circuitry to establish the retention state of the isolation circuitry to prevent the master portion from changing the slave data stored by the slave portion for the retention operational mode.

14. The data retention circuitry of claim 13, wherein the means for power multiplexing comprises means for switching between coupling the slave portion to the first power rail and coupling the slave portion to the second power rail.

15. The data retention circuitry of claim 13, wherein the flip-flop further includes means for isolating the slave portion from the master portion for the retention operational mode.

16. The data retention circuitry of claim 13, further comprising means for removing power from the first power rail for the retention operational mode.

17. The data retention circuitry of claim 13, wherein:
the data retention circuitry further comprises:
a first power supply coupled to the first power rail; and
a second power supply coupled to the second power rail;
the means for power multiplexing comprises a means for switching between coupling the slave portion to the first power rail and coupling the slave portion to the second power rail, the means for switching configured to operate during a transitional period that occurs between the regular operational mode and the retention operational mode;
the master portion of the flip-flop is configured to receive power supplied by the first power supply for the regular operational mode; and
the slave portion of the flip-flop is configured to receive power supplied by the first power supply for the regular operational mode and to receive power supplied by the second power supply for the retention operational mode.

18. The data retention circuitry of claim 17, wherein:
the first power supply comprises a first switched-mode power supply;
the second power supply comprises a second switched-mode power supply; and
the data retention circuitry further comprises means for collapsing power that is configured to cause the first switched-mode power supply to cease supplying power for the retention operational mode.

19. A method for power multiplexing with flip-flops, comprising:
supplying power to a master portion of a flip-flop using a first power supply via a first power rail for a regular operational mode;
supplying power to a slave portion of the flip-flop using the first power supply via the first power rail for the regular operational mode;
during a power-down transitional period after the regular operational mode and before a retention operational mode, switching the slave portion of the flip-flop from the first power supply to a second power supply;
supplying power to the slave portion of the flip-flop using the second power supply via a second power rail for the retention operational mode;
isolating the master portion from the slave portion for the retention operational mode;
establishing a retention state to prevent the master portion from changing slave data stored by the slave portion for the retention operational mode
clamping a clock signal responsive to an active state of a retention signal to produce a controlled clock signal; and
providing the controlled clock signal to establish the retention state to prevent the master portion from changing the slave data stored by the slave portion for the retention operational mode.

20. The method of claim 19, further comprising:
for the power-down transitional period, supplying power to the master portion of the flip-flop using the first power supply via the first power rail; and for the power-down transitional period, supplying power to the slave portion of the flip-flop using the second power supply via the second power rail.

21. The method of claim 19, further comprising:
turning off the first power supply for the retention operational mode.

22. The method of claim 19, wherein the switching comprises:
disconnecting the slave portion of the flip-flop from the first power rail; and
connecting the slave portion of the flip-flop to the second power rail.

23. The method of claim 19, further comprising:
experiencing, by the master portion of the flip-flop, a power collapse for the retention operational mode; and
retaining, by the slave portion of the flip-flop, slave data for the retention operational mode.

24. Data retention circuitry comprising:
a collapsible power rail configured to undergo a power collapse for a retention operational mode;
a memory power rail configured to sustain a voltage level that is sufficient to maintain contents of a memory for the retention operational mode;
a flip-flop including a master portion and a slave portion, the master portion coupled to the collapsible power rail, the slave portion configured to retain slave data for the retention operational mode if the master portion experiences the power collapse, the flip-flop further including isolation circuitry configured to isolate the master portion from the slave portion for the retention operational mode; and
power management circuitry including clamping circuitry configured to clamp a clock signal responsive to an active state of a retention signal to produce a controlled clock signal wherein the power management circuitry is configured to:
couple the slave portion to the collapsible power rail for a regular operational mode;
couple the slave portion to the memory power rail for the retention operational mode;
remove power from the collapsible power rail after the slave portion is coupled to the memory power rail for the retention operational mode; and
establish a retention state of the isolation circuitry to prevent the master portion from changing the slave data stored by the slave portion for the retention operational mode, and provide the controlled clock signal to the isolation circuitry to establish the retention state of the isolation circuitry to prevent the master portion from changing the slave data stored by the slave portion for the retention operational mode.

25. The data retention circuitry of claim 24, wherein:
the data retention circuitry further comprises:
a first power supply coupled to the collapsible power rail; and
a second power supply coupled to the memory power rail; and
the power management circuitry is further configured to:
turn off the first power supply to remove the power from the collapsible power rail for the retention operational mode; and
decrease a voltage level supplied by the second power supply to the memory power rail for the retention operational mode.

26. The data retention circuitry of claim 24, wherein the power management circuitry is further configured to:
restore the power to the collapsible power rail for the regular operational mode;
decouple the slave portion from the collapsible power rail for the retention operational mode; and
decouple the slave portion from the memory power rail for the regular operational mode.

* * * * *